(12) United States Patent
Fujikawa

(10) Patent No.: US 11,550,194 B2
(45) Date of Patent: Jan. 10, 2023

(54) ACTIVE MATRIX SUBSTRATE AND DISPLAY PANEL

(71) Applicant: SHARP KABUSHIKI KAISHA, Sakai (JP)

(72) Inventor: Yohsuke Fujikawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/477,473

(22) Filed: Sep. 16, 2021

(65) Prior Publication Data

US 2022/0107536 A1   Apr. 7, 2022

Related U.S. Application Data

(60) Provisional application No. 63/086,731, filed on Oct. 2, 2020.

(51) Int. Cl.

| | | |
|---|---|---|
| *G02F 1/1362* | (2006.01) | |
| *G02F 1/1343* | (2006.01) | |
| *G02F 1/1368* | (2006.01) | |
| *H01L 27/12* | (2006.01) | |
| *G06F 3/041* | (2006.01) | |
| *G02F 1/1333* | (2006.01) | |

(52) U.S. Cl.
CPC ...... *G02F 1/136286* (2013.01); *G02F 1/1368* (2013.01); *G02F 1/13338* (2013.01); *G02F 1/134327* (2013.01); *G06F 3/0412* (2013.01); *H01L 27/124* (2013.01); *H01L 27/1218* (2013.01); *G02F 2201/56* (2013.01)

(58) Field of Classification Search
CPC ......... G02F 1/136286; G02F 1/13338; G02F 1/134327; G02F 1/1368; G02F 2201/56; G06F 3/0412; H01L 27/1218; H01L 27/124
See application file for complete search history.

(56) References Cited

U.S. PATENT DOCUMENTS

| | | | |
|---|---|---|---|
| 2014/0240279 A1 | 8/2014 | Hwang et al. | |
| 2018/0040683 A1* | 2/2018 | Matsueda | ........... H01L 27/3276 |
| 2018/0239180 A1* | 8/2018 | Ogasawara | ........... G02F 1/1345 |
| 2019/0041711 A1* | 2/2019 | Fujikawa | ............ G02F 1/13452 |

FOREIGN PATENT DOCUMENTS

| | | |
|---|---|---|
| JP | 2014-164752 A | 9/2014 |
| JP | 2018-022117 A | 2/2018 |
| WO | 2017/138469 A1 | 8/2017 |

\* cited by examiner

*Primary Examiner* — James A Dudek

(74) *Attorney, Agent, or Firm* — ScienBiziP, P.C.

(57) ABSTRACT

An active matrix substrate includes multiple data signal line connection wires that are disposed near a first end portion and multiple divided common electrode wire connection wires that are disposed near a second end portion. A distance between end portions of the multiple data signal line connection wires facing multiple data signal terminals is shorter than a distance between end portions of the multiple data signal line connection wires facing a pixel region. A distance between end portions of the multiple divided common electrode wire connection wires facing divided common electrode terminals is shorter than a distance between end portions of the multiple divided common electrode wire connection wires facing the pixel region.

8 Claims, 10 Drawing Sheets

ACTIVE MATRIX SUBSTRATE AND DISPLAY PANEL

BACKGROUND

1. Field

The present disclosure relates to an active matrix substrate and a display panel.

2. Description of the Related Art

A display panel that is typified by a liquid crystal display device is included in various electronic devices. In particular, a display panel that has an active matrix substrate is included in a portable electronic device. A display device that has a touch screen function and that has been recently used includes self-capacitance common electrodes (divided common electrodes) that are formed by using an electrostatic capacity method in a matrix on an active matrix substrate in a liquid crystal cell (a display panel). Such display devices are disclosed in, for example, Japanese Unexamined Patent Application Publication No. 2014-164752 and International Publication No. 2017/138469. A display device that has a shape with a design feature that is typified by a circular shape is proposed. Such a display device is disclosed in, for example, Japanese Unexamined Patent Application Publication No. 2018-22117.

In the display devices described above, a drive circuit such as a gate driver that is composed of low-temperature polycrystalline silicon is formed on an active matrix substrate that is used for a display panel. As a result of the gate driver being contained, the number of at least two mounting sides (regions in which circuits are mounted), which have been used, decreases. In particular, in the case of a rectangular display panel, a structure that is also called a three-sides-free structure is achieved.

In the case where the active matrix substrate (the display panel) has another function (for example, the touch screen function) other than a display function, multiple signal lines (data signal lines) used for image display and other functional wires (for example, multiple common electrode wires used for touch detection) extend to terminals that are disposed at an end portion (an edge portion) of the active matrix substrate. These wires concentrate on the frame of the single edge portion around a pixel region of the active matrix substrate. Consequently, the size of the frame increases, and a product to which the display panel is incorporated lacks the design feature. That is, in the case where the other function (the touch screen) is fulfilled without change in the dimensions of the pixel region, the active matrix substrate has an increased size. In the case where the size of the active matrix substrate is not changed, the size of the pixel region is decreased.

It is desirable to provide an active matrix substrate and a display panel that can increase the degree of freedom of the design feature of a product to which the display panel that includes the active matrix substrate is incorporated and that can improve the design feature.

SUMMARY

An active matrix substrate according to an aspect disclosed below is an active matrix substrate that has a pixel region and that includes multiple pixels that are disposed in the pixel region. The active matrix substrate includes multiple scanning signal lines, multiple data signal lines that intersect the multiple scanning signal lines, multiple switching elements that are disposed at respective multiple intersecting portions of the multiple data signal lines and the multiple scanning signal lines, multiple pixel electrodes that are connected to the respective multiple switching elements, a common electrode that is disposed in the pixel region, the common electrode including multiple divided common electrodes that are divided in a matrix, multiple divided common electrode wires that are connected to the respective multiple divided common electrodes and that are disposed in the pixel region, multiple data signal terminals that are disposed at a first end portion of the active matrix substrate, divided common electrode terminals that are disposed at a second end portion that differs from the first end portion of the active matrix substrate, multiple data signal line connection wires that connect the multiple data signal lines and the multiple data signal terminals to each other, and multiple divided common electrode wire connection wires that connect the multiple divided common electrode wires and the multiple divided common electrode terminals to each other. A distance between end portions of the multiple data signal line connection wires facing the multiple data signal terminals is shorter than a distance between end portions of the multiple data signal line connection wires facing the pixel region. A distance between end portions of the multiple divided common electrode wire connection wires facing the divided common electrode terminals is shorter than a distance between end portions of the multiple divided common electrode wire connection wires facing the pixel region.

DESCRIPTION OF THE EMBODIMENTS

Figure 1:
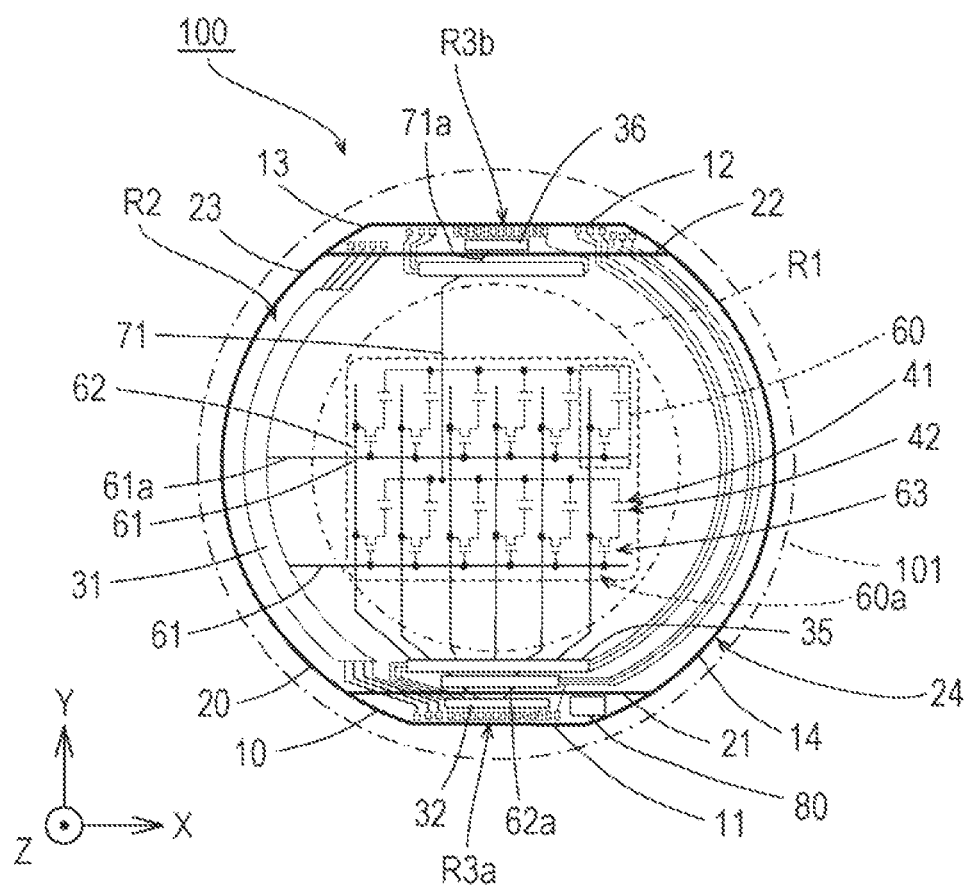
FIG. 1 is a plan view of an active matrix substrate.

Embodiments of the present disclosure will hereinafter be described with reference to the drawings. The present disclosure is not limited to the embodiments described below, and design can be appropriately modified within a range in which a structure according to the present disclosure is satisfied. In the following description, like reference signs for components that have like or similar functions are shared and used in the different drawings, and the repeated description thereof is omitted. Components described according to the embodiments and a modification may be appropriately combined or modified. In the drawings referred in the following description, a component is simplified or schematically illustrated, and a component is omitted to make the description easy to understand. The ratio of the dimensions of the components illustrated in the drawings is not necessarily equal to that of actual dimensions.

First Embodiment

Figure 2:
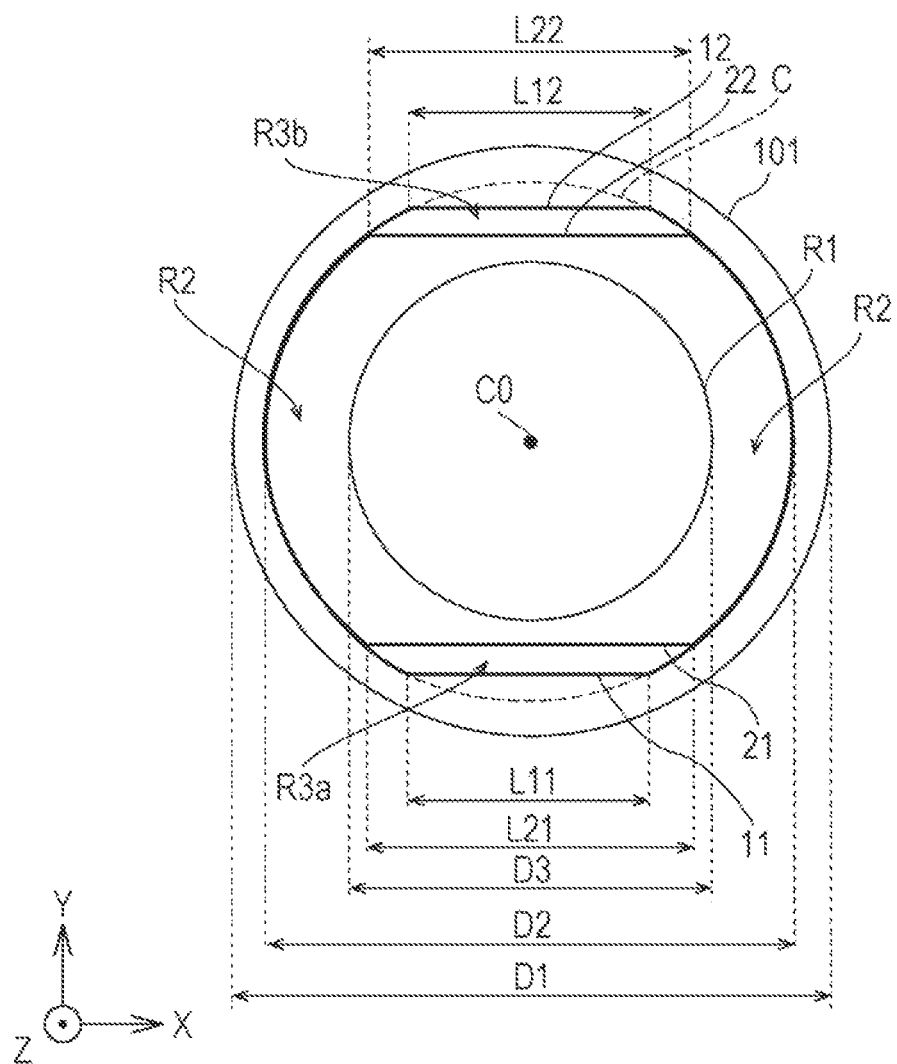
FIG. 2 is a plan view for description of a relationship of dimensions of the active matrix substrate.
Figure 3:
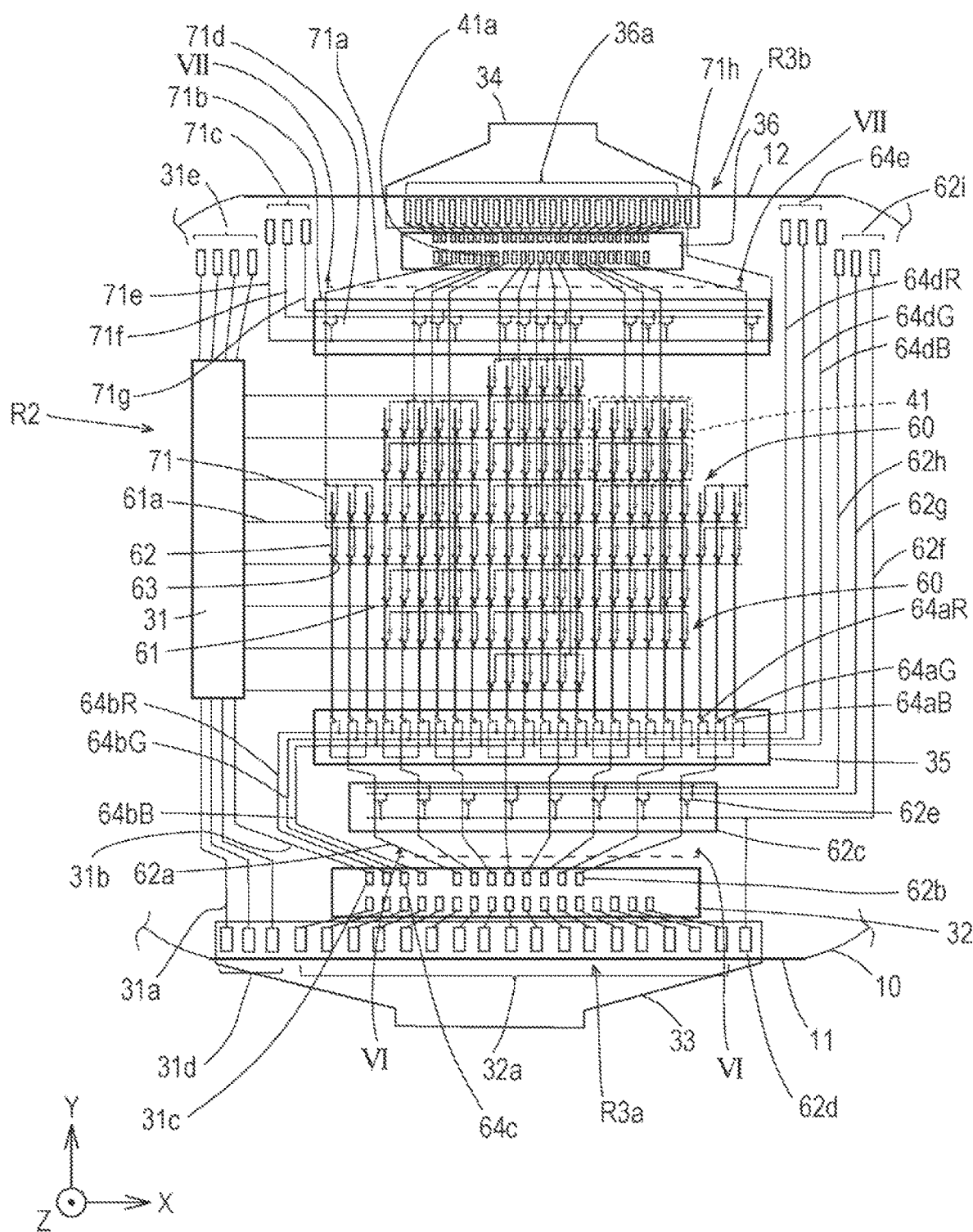
FIG. 3 is a plan view for description of an inner structure of the active matrix substrate.
Figure 4:
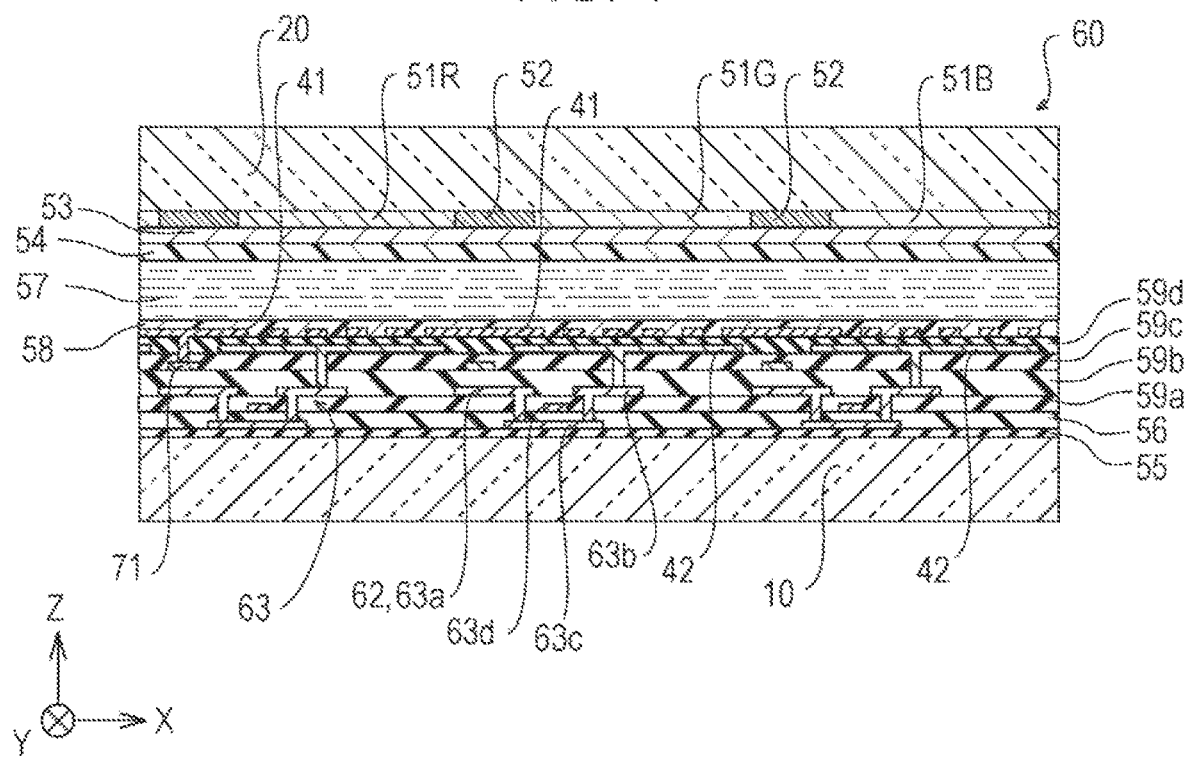
FIG. 4 is a sectional view of a pixel of the active matrix substrate.
Figure 5:
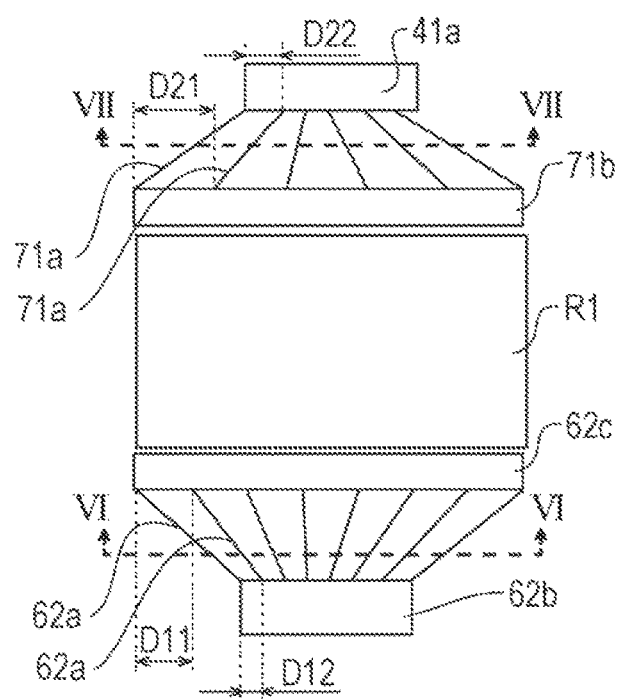
FIG. 5 is a schematic plan view of FIG. 3.

FIG. 1 is a plan view of a display panel 100 (a liquid crystal cell). FIG. 2 is a schematic view for description of a relationship of dimensions of a pixel region R1, a first substrate 10, and a second substrate 20. FIG. 3 is a schematic plan view for description of connections of wires and circuits that are formed above the first substrate 10. FIG. 4 is a sectional view of one of pixels 60 of the display panel 100. FIG. 5 is a schematic plan view of FIG. 3. An "active matrix substrate" described in the present specification includes the first substrate 10, and the wires and the circuits that are formed above the first substrate 10. The active matrix substrate is also referred to as an array substrate, or an element substrate.

As for the display panel 100, as illustrated in FIG. 1, the first substrate 10 composed of glass and the second substrate 20 (a color filter substrate) composed of glass are disposed so as to face each other. The first substrate 10 and the second substrate 20 are bonded to each other with a sealing material that is not illustrated interposed therebetween. The second substrate 20 is also referred to as a facing substrate. For example, a dimension (a dimension in the direction of a Y-axis) of the first substrate 10 is larger than a dimension of the second substrate 20. The sealing material, not illustrated, has a closed frame shape and is formed so as to be along an end portion of the second substrate 20. A liquid crystal material 57 (see FIG. 4) is held in a space inside the sealing material.

As illustrated in FIG. 2, the pixel region R1 is a region in which an image is displayed and has a circular shape. The display panel 100 that has the pixel region R1 that has the circular shape is suitable for, for example, a clock and a meter that is included in a product. According to a first embodiment, the first substrate 10 and the second substrate 20 of the display panel 100 have respective circular shapes such that the display panel 100 can be incorporated into a product that includes a housing 101 that has a circular shape in a plan view without a lack of the design feature of the product. The diameter D2 of an imaginary circle C is larger than the diameter D3 of the pixel region R1. For example, the first substrate 10 and the second substrate 20 have shapes that follow the shape of the imaginary circle C that has the diameter D2 smaller than the diameter D1 of the circle of the housing 101 of the product. The center of the circle C, the center of the pixel region R1, and the center of the housing 101 match each other at a center CO.

As illustrated in FIG. 2, the first substrate 10 includes edge portions 11 and 12 that are formed by cutting the imaginary circle C and that have straight sides. The second substrate 20 includes edge portions 21 and 22 that are formed by cutting the imaginary circle C and that have straight sides. The edge portion 11, the edge portion 12, the edge portion 21, and the edge portion 22 are parallel to each other. The length L21 of the edge portion 21 is longer than the length L11 of the edge portion 11. The length L22 of the edge portion 22 is longer than the length L12 of the edge portion 12. A surface of the first substrate 10 between the edge portion 11 and the edge portion 21, a surface of the first substrate 10 between the edge portion 12 and the edge portion 22 correspond to mounting regions R3a and R3b in which driver ICs or FPCs (flexible printed circuit boards) are mounted.

As illustrated in FIG. 1, the external form of the first substrate 10 in a plan view has two sides and two arcs. That is, as for the first substrate 10, the edge portion 11, an arc 13, the edge portion 12, and an arc 14 are connected to each other in this order. The external form of the second substrate 20 in a plan view has two sides and two arcs. As for the second substrate 20, the edge portion 21, an arc 23, the edge portion 22, and an arc 24 are connected to each other in this order.

The first substrate 10 and the second substrate 20 described above are formed through predetermined processes while being imposed on mother glass. Bonding is performed such that a membrane surface of the first substrate 10 and a membrane surface of the second substrate 20 face each other with the sealing material interposed therebetween. During bonding, a step of applying liquid crystal and enclosing the liquid crystal material 57 in the display panel 100 may be taken. The first substrate 10 and the second substrate 20 that are bonded to each other are divided so as to have predetermined shapes (see FIG. 1) into the display panel 100 that is cut. The display panel 100 that is cut may be inspected for lighting by being energized in a simple manner. After inspection, an optical member (not illustrated) such as a polarizer is attached to the outer surface of the first substrate 10 and the outer surface of the second substrate 20 of the display panel 100 that is a good product. A backlight (not illustrated) is installed on the outer surface of the first substrate 10 (opposite of the display panel 100 from a user).

Basic Structure of First Substrate 10

As illustrated in FIG. 2, the first substrate 10 has the pixel region R1 that occupies a circular region, a frame region R2 around the pixel region R1, and mounting regions R3 in which the driver ICs (a data signal driver IC 32 and a common electrode driver IC 36) and the FPCs (a first FPC 33 and a second FPC 34) are mounted as illustrated in FIG. 3.

In the pixel region R1, as illustrated in FIG. 3, the multiple pixels 60 are arranged in a matrix. Each pixel 60 typically includes a red (R) sub-pixel, a green (G) sub-pixel, and a blue (B) sub-pixel. Accordingly, in the display panel 100 that is constituted so as to enable color display, the sub-pixels for three primary colors are arranged in a matrix. In the case where the display panel is constituted for monochrome display, there are no sub-pixels, but there is merely an array of the pixels 60 in the pixel region R1. In the present specification, the pixels and the sub-pixels are not distinguished and are referred to as the pixels 60 unless otherwise particularly described.

In the case where the pixel region R1 is a color region in an atypical form (a shape other than a rectangular shape) such as a circle, RGB sub-pixels are disposed so as to cover the pixel region R1 in the atypical form, and the pixels 60 are disposed stepwise along the edge of the pixel region R1 on the boundary between the edge of the region in the atypical form and the frame region R2. An alignment film composed of, for example, polyimide may be formed on a surface in the pixel region R1 in which the pixels 60 are disposed, and processes such as rubbing and photoalignment may be performed.

In the frame region R2, a wire and a circuit for driving each pixel 60 are disposed on the surface of the first substrate 10 that faces the second substrate 20. According to the first embodiment, a gate driver 31 that is composed of low-temperature polycrystalline silicon and that is monolithic is formed on a surface of the first substrate 10 in the frame region R2 and scans a screen. For writing on the screen, an output from the data signal driver IC 32 that is mounted on the edge portion 11 (the mounting region R3a) is written to the pixels 60 via a RGB switch circuit 35 that is formed on the frame of the surface of the first substrate 10.

The display panel 100 has not only a function of displaying an image but also a function of detecting a touch with, for example, a finger. Specifically, a common electrode (a touch electrode) that faces pixel electrodes 42, data signal lines 62 (source bus lines), and scanning signal lines 61 (gate bus lines) described later and that is common is formed along the surface of the first substrate 10 that faces the second substrate 20 so as to cover the entire pixel region R1. The common electrode is divided into multiple pieces. The divided pieces of the common electrode are referred to below as divided common electrodes 41. The multiple divided common electrodes 41 function as respective sensors for detecting a touch with, for example, a finger. The divided common electrodes 41 are controlled by the common electrode driver IC 36 that is mounted on the edge portion 12 (the mounting region R3b). The mounting region R3a is a region in which a circuit member related to scanning of the screen and writing of data is mounted and corresponds to a portion near the edge portion 11. The mounting region R3b is a region in which a circuit member related to control of the divided common electrodes 41 and touch detection is mounted and corresponds to a portion near the edge portion 12.

The data signal driver IC 32 and the first FPC 33 are mounted on the edge portion 11. Gate driver control terminals 31c and 31d, and a data signal driver IC drive terminal 32a are disposed on the surface of the first substrate 10 that faces the second substrate 20 at the edge portion 11. The gate driver control terminals 31c and 31d provide a signal such as power to gate driver control wires 31a. A terminal that provides a signal to data signal line connection wires 62a, RGB switch element control wires 64bR, 64bG, and 64bB, and a gate driver control wire 31b is disposed on the surface of the first substrate 10 that faces the second substrate 20 right below the data signal driver IC 32. An inspection switch blockage terminal that is included in an inspection circuit may be disposed on the surface of the first substrate 10 that faces the second substrate 20 at the edge portion 11. In FIG. 3, a data signal line inspection switch element blockage terminal 62d is disposed on the surface of the first substrate 10 that faces the second substrate 20 at the edge portion 11. In the case where the RGB switch element control wires 64bR, 64bG, and 64bB are not distinguished, these are referred to as "RGB switch element control wires 64b".

The common electrode driver IC 36 and the second FPC 34 are mounted on the edge portion 12. A touch detection driver IC drive terminal 36a is disposed on the surface of the first substrate 10 that faces the second substrate 20 at the edge portion 12. Divided common electrode wire connection wires (referred to below as "wires 71a") are disposed on the surface of the first substrate 10 that faces the second substrate 20 right below the common electrode driver IC 36. In addition, a terminal that provides a signal to the wires 71a is disposed. Data signal line inspection circuit terminals 62i, inspection RGB switch element control terminals 64e, divided common electrode wire inspection circuit terminals 71c, and gate driver inspection terminals 31e are disposed on the surface of the first substrate 10 that faces the second substrate 20 at the edge portion 12 (the mounting region R3b). A divided common electrode wire inspection switch element blockage terminal 71h that is included in the inspection circuit is disposed on the surface of the first substrate 10 that faces the second substrate 20 at the edge portion 12.

Basic Structure of Second Substrate 20

The second substrate 20 has a pixel region R1 that occupies a circular region and a region (a frame region R2) therearound. In the pixel region R1, as illustrated in FIG. 4, red (R), green (G), and blue (B) color filters are disposed on the surface of the second substrate 20 that faces the first substrate 10 so as to be associated with the pixels 60 that are formed on the first substrate 10. As illustrated in FIG. 4, a color filter 51R in R, a color filter 51G in G, and a color filter 51B in B are patterned. In the case where the color filters 51R, 51G, and 51B are not particularly distinguished, these are referred to below as "color filters 51".

As illustrated in FIG. 4, the display panel 100 includes black matrices 52 (light-shielding films) to shield, from light, a region in which the alignment of the liquid crystal is unable to be controlled and in which the light leaks. The black matrices 52 are formed between the color filters 51 and in a region that is on the surface of the second substrate 20 facing the first substrate 10 and that faces a region between the pixels 60 above the first substrate 10. The black matrices 52 are composed of metal or black resin.

The surface of the second substrate 20 has unevenness due to the color filters 51 and the black matrices 52. For this reason, the alignment of the liquid crystal is likely to be disturbed. For this reason, an overcoat film 53 may be formed so as to cover the color filters 51 and the black matrices 52. An alignment film 54 (see FIG. 4) composed of, for example, polyimide is formed along the surface of the second substrate 20 that faces the first substrate 10 in the pixel region R1 in which the color filters 51, for example, are formed, and processes such as rubbing and photoalignment are performed.

Pixel 60

In each pixel 60, as illustrated in FIG. 1, the scanning signal line 61 (the gate bus line), the data signal line 62 (the source bus line), a switching element 63, the common electrode (the divided common electrodes 41), and the pixel electrode 42 are disposed along the surface of the first substrate 10 that faces the second substrate 20. For example, the scanning signal lines 61 are formed to be parallel to each other. The data signal lines 62 are formed to be parallel to each other. The switching elements 63 for controlling the pixels 60 are disposed at intersecting portions 60a of the scanning signal lines 61 and the data signal lines 62. The display panel 100 uses a method of aligning the liquid crystal in a transverse electric field manner and has the structure of the pixels 60 that is so-called FFS (Fringe Field Switching).

As illustrated in FIG. 4, the switching elements 63 that are disposed in the respective pixels 60 are formed by using thin-film transistors composed of low-temperature polysilicon. Source electrodes 63a of the switching elements 63 that are disposed in the respective pixels 60 are connected to the data signal lines 62. Drain electrodes 63b of the switching elements 63 are connected to the pixel electrodes 42. The pixel electrodes 42 and the divided common electrodes 41 are formed in this order above the first substrate 10. The pixel electrodes 42 and the divided common electrodes 41 are formed so as to overlap with an insulating film 59*d* interposed therebetween. The pixel electrodes 42 are separately patterned per pixel. That is, the number of the sub-pixels described above is equal to the number of the pixel electrodes 42.

Each divided common electrode 41 has a slit such that the alignment of the liquid crystal in a FFS manner can be controlled. The divided common electrodes 41 are patterned per unit including the multiple pixels 60 so as to be capable of functioning as the common electrode. As illustrated in FIG. 3, the pixel region R1 is covered by the multiple divided common electrodes 41. The number of the divided common electrodes 41 is smaller than the number of the pixel electrodes 42. FIG. 1 illustrates an example in which the single divided common electrode 41 covers the range of twelve sub-pixels of six sub-pixels in an X-direction and two sub-pixels in a Y-direction.

While the image is displayed, a predetermined potential is applied to the divided common electrodes 41 as facing electrodes for the pixel electrodes 42. While a touch is detected, touch scanning signals are provided to the divided common electrodes 41. The signals are separately provided to the respective divided common electrodes 41. In view of this, as illustrated in FIG. 3, the display panel 100 includes multiple divided common electrode wires 71 (referred to below as "wires 71"). The wires 71 are connected to the respective divided common electrodes 41.

As illustrated in FIG. 4, structures in the pixels 60 described above on the first substrate 10 are manufactured as follows. An insulating film composed of, for example, silicon oxide or silicon nitride is formed as a base coating 55 on the surface of the first substrate 10 composed of glass that faces the second substrate 20. Subsequently, a semiconductor layer 63*c* that is to be channel portions for the switching elements 63 is formed and patterned into a predetermined shape. Low-temperature polycrystalline silicon can be used as the semiconductor layer 63*c*. A gate insulating film 56 composed of, for example, silicon oxide or silicon nitride is formed in an upper layer thereon. A first conductive film that is to be gate electrodes 63*d* is formed in an upper layer thereon. The first conductive film is patterned into a predetermined shape. The first conductive film is composed of, for example, Ta (tantalum) or W (tungsten). That is, a multilayer film obtained by combining a metal thin film or an alloy thin film that has relatively high resistance value and a high melting point such as Ta or W and another film can be used as the first conductive film.

As illustrated in FIG. 4, an insulating film 59*a* composed of, for example, silicon oxide or silicon nitride is formed in an upper layer on the gate electrodes 63*d*. Contact holes are formed in the gate insulating film 56 and the insulating film 59*a* on the semiconductor layer located at both end portions of the channel portions for the switching elements 63, a second conductive film that is to be the source electrodes 63*a* and the drain electrodes 63*b* of the switching elements 63 is formed and is patterned into a predetermined shape. A multilayer film of a metal thin film composed of, for example, aluminum, copper, or chromium, alloy, and another film can be used as the second conductive film. When the second conductive film and the first conductive film described above are patterned, the scanning signal lines 61 (see FIG. 3) and the data signal lines 62 are patterned in the same process.

The switching elements 63 are completed through the processes described above. Processes described below may also be performed to constitute the pixels 60 of the display panel 100. An insulating film 59*b* that is composed of, for example, acrylic resin and that is relatively thick is formed in an upper layer on the second conductive film. Contact holes are formed in the insulating film 59*b* that covers an end portion of the drain electrodes 63*b* such that the pixel electrodes 42 and the drain electrodes 63*b* of the switching elements 63 can be connected to each other. A third conductive film that is to be the wires 71 is formed in an upper layer on the insulating film 59*b* and patterned into a predetermined shape. An insulating film 59*c* for protecting the third conductive film and for inhibiting a short circuit with the pixel electrodes 42 is formed by using silicon oxide or silicon nitride. Contact holes are formed in the insulating film 59*c* at the positions of the contact holes of the insulating film 59*b*. A transparent electrode that is to be the pixel electrodes 42 is formed in an upper layer on the insulating film 59*c* and is patterned into a predetermined shape. ITO or IZO is used as the transparent electrode. The pixel electrodes 42 are connected to the drain electrodes 63*b* of the switching elements 63. The insulating film 59*d* is formed in an upper layer on the pixel electrodes 42 by using silicon oxide or silicon nitride in order to separate the pixel electrodes 42 and the common electrode (the divided common electrodes 41) and to form a storage capacitor.

The divided common electrodes 41 are connected to the wires 71 for controlling the touch detection. For this reason, contact holes are formed in the insulating film 59*d* and the insulating film 59*c* that are located above the wires 71, and the divided common electrodes 41 and the wires 71 are connected to each other via the contact holes. A transparent electrode that is to be the divided common electrodes 41 is formed above the first substrate 10 and is patterned into a predetermined shape after the insulating film 59*d* described above is formed. ITO or IZO is used as the transparent electrode. At this time, a slit that is used to drive the FFS is formed in the common electrode (the divided common electrodes 41) per pixel. An alignment film 58 composed of, for example, polyimide is formed on the divided common electrodes 41.

Gate Driver 31

As illustrated in FIG. 1, the gate driver 31 that includes a switching element and that is composed of low-temperature polycrystalline silicon is monolithically formed along the edge of the pixel region R1 (into an arc shape). As illustrated in FIG. 3, the gate driver 31 is controlled by using a signal that is transmitted to the gate driver control terminal 31*d* that is disposed on the surface of the edge portion 11 (the mounting region R3*a*) of the first substrate 10 that faces the second substrate 20 and to the gate driver control terminal 31*c* that is disposed right below the data signal driver IC 32. The gate driver 31 and the scanning signal lines 61 in the pixel region R1 are connected to each other with scanning signal line connection wires 61*a* interposed therebetween.

The gate driver 31 and the gate driver control terminal 31*d* are connected to each other with the gate driver control wires 31*a* interposed therebetween. The gate driver 31 and the gate driver control terminal 31*c* are connected to each other with the gate driver control wire 31*b* interposed therebetween. An example of the gate driver control wires 31*a* is a supply wire. An example of the gate driver control wire 31*b* is a wire for a clock signal, an initialization signal, a start signal, and a scanning direction switching signal.

The gate driver inspection terminals 31*e* are disposed on the surface of the edge portion 12 (the mounting region R3*b*)

of the first substrate 10 that faces the second substrate 20. The gate driver inspection terminals 31e are disposed to determine whether the operation of the circuit of the gate driver 31 is good or bad by simply inputting a signal into the gate driver inspection terminals 31e before the circuit member such as the driver IC is mounted on the display panel 100 and whether the display panel 100 is good or bad. Accordingly, the gate driver inspection terminals 31e may be patterned more widely (so as to have larger dimensions) than the dimensions of the gate driver control terminal 31c on which the first FPC 33 that is disposed at the edge portion 11 is mounted such that a probe needle for an inspection signal is readily brought into contact.

Scanning Signal Line Connection Wire

As illustrated in FIG. 3, the scanning signal line connection wires 61a connect the scanning signal lines 61 and the gate driver 31 to each other. In the present specification, the scanning signal line connection wires 61a are described as wires that extend over the whole or freely-selected partial sections of wiring paths between the scanning signal lines 61 and the gate driver 31.

The scanning signal line connection wires 61a extend from the pixels 60 that are disposed on the outermost circumference of the pixel region R1 to the gate driver 31 with the distances between the scanning signal lines 61 maintained. In the case where the length of the gate driver 31 in an arrangement direction is smaller than the dimension of the pixel region R1 in the arrangement direction of the gate driver 31, distances between second ends of the scanning signal line connection wires 61a that face the gate driver 31 may be shorter than distances between first ends of the scanning signal line connection wires 61a in the pixel region R1. In this case, for example, the scanning signal line connection wires 61a obliquely extend to form a sectorial shape or extend stepwise in a plan view.

In the case where the pixel region R1 is circular as in the first embodiment (see FIG. 1), the scanning signal line connection wires 61a may be patterned by using the same conductive film (the first conductive film) as the gate electrodes 63d. This enables the wires 71a and the data signal line connection wires 62a composed of the second conductive film (or the third conductive film) to intersect the scanning signal line connection wires 61a in a freely-selected manner depending on the shape of the active matrix substrate (the first substrate 10) with the insulating film interposed therebetween. The data signal line connection wires 62a and the scanning signal line connection wires 61a at least partly overlap in a plan view. The wires 71a and the scanning signal line connection wires 61a at least partly overlap in a plan view.

RGB Switch Circuit 35

According to the first embodiment, as illustrated in FIG. 3, the RGB switch circuit 35 is disposed between data signal terminals 62b and the data signal lines 62. The RGB switch circuit 35 has a function of distributing a data signal that is transmitted from the data signal driver IC 32 to the multiple data signal lines 62. The RGB switch circuit 35 is also referred to as, for example, a demultiplexer or a selector circuit, enables the number of the data signal line connection wires 62a to be smaller than that of the data signal lines 62, and enables the size of a region (the frame) for wiring to be decreased. In more detail, the RGB switch circuit 35 has a function of assigning each single data signal line connection wire 62a to three of the data signal lines 62 in RGB that are located in the pixel region R1. That is, three RGB switch elements are provided for each data signal line connection wire 62a. Specifically, a RGB switch element 64aR for assigning to the data signal line 62 in R, a RGB switch element 64aG for assigning to the data signal line 62 in G, and a RGB switch element 64aB for assigning to the data signal lines 62 in B are disposed. The RGB switch elements are turned ON in a time division manner to distribute the data signal. The RGB switch elements 64aR, 64aG, and 64aB can be formed by using switching elements.

The RGB switch elements 64aR, 64aG, and 64aB are controlled by connecting respective gate electrodes to the RGB switch element control wires 64bR, 64bG, and 64bB. That is, the RGB switch element control wire 64bR for controlling the gate electrode of the RGB switch element 64aR, the RGB switch element control wire 64bG for controlling the gate electrode of the RGB switch element 64aG, and the RGB switch element control wire 64bB for controlling the gate electrode of the RGB switch element 64aB are provided, and the three RGB switch element control wires 64b are connected to respective RGB switch element control terminals 64c right below the data signal driver IC 32. The switching elements that are to be the RGB switch elements are controlled so as to be turned ON or OFF, based on signals from the three RGB switch element control terminals 64c. Source electrodes of the three switching elements that are to be the RGB switch elements are connected to one of the data signal line connection wires 62a so as to satisfy a relationship of 3 to 1. Drain electrodes of the three switching elements are connected to the respective data signal lines 62 that are located in the pixel region R1 so as to satisfy a relationship of 1 to 1.

The inspection RGB switch element control terminals 64e are disposed on the surface of the edge portion 12 of the first substrate 10 that faces the second substrate 20. Three of the inspection RGB switch element control terminals 64e in RGB are connected to ends of the RGB switch element control wires 64bR, 64bG, and 64bB with inspection RGB switch element control wires 64dR, 64dG, and 64dB interposed therebetween.

The inspection RGB switch element control terminals 64e are provided to determine whether the operation of the RGB switch circuit 35 is good or bad by simply inputting a signal into the inspection RGB switch element control terminals 64e before the circuit member such as the driver IC is mounted on the display panel 100. Accordingly, the inspection RGB switch element control terminals 64e may be patterned relatively widely such that the probe needle for the inspection signal is readily brought into contact.

Data Signal Line Inspection Circuit 62c

According to the first embodiment, as illustrated in FIG. 3, a data signal line inspection circuit 62c is disposed between the data signal terminals 62b and the RGB switch circuit 35 right below the data signal driver IC 32. The data signal line inspection circuit 62c functions as an inspection circuit instead of the data signal driver IC 32. That is, the data signal line inspection circuit 62c is provided to check the operation of the RGB switch circuit 35 and the quality of the image display in a manner in which the data signal line connection wires 62a are energized by using the data signal line inspection circuit 62c during a simple inspection that is carried out before the circuit member such as the driver IC is mounted on the display panel 100.

The data signal line inspection circuit 62c includes data signal line inspection switch elements 62e the number of which is equal to that of the data signal line connection wires 62a and data signal line inspection circuit control wires 62f, 62g, and 62h (also referred to below as "wires 62f, 62g, and 62h"). This thin-film transistor can be formed by using a method conforming the formation of the pixels. The wires 62f, 62g, and 62h extend to the data signal line inspection circuit terminals 62i that are disposed on the surface of the edge portion 12 of the first substrate 10 that faces the second substrate 20 via the frame of the pixel region R1 opposite the frame on which the gate driver 31 is disposed.

The data signal line inspection circuit 62c will be further described in detail. A single inspection circuit thin-film transistor is provided for each data signal line connection wire 62a. All of gate electrodes of the thin-film transistors are connected to the single wire 62f. When the display panel 100 is inspected, all of the thin-film transistors are turned ON by energizing all of the gate electrodes of the thin-film transistors in the inspection circuit by using the single wire 62f.

The thin-film transistors that are located in the data signal line inspection circuit 62c are turned ON only during inspection and to be kept OFF after mounting ends, and the product is obtained. In view of this, it is preferable that a wire that is split from the wire 62f be formed and connected to the data signal line inspection switch element blockage terminal 62d that is disposed on the surface of the edge portion 11 of the first substrate 10 that faces the second substrate 20, and OFF potential be continuously applied to the data signal line inspection switch element blockage terminal 62d. The first FPC 33 is mounted on the edge portion 11 (the mounting region R3a). Accordingly, in the case where there is a terminal to which fixed potential is to be continuously applied, the terminal to which the fixed potential is to be continuously applied may be disposed at the edge portion 11, and the OFF potential may be applied via the first FPC 33.

Source electrodes of the thin-film transistors for the data signal line inspection circuit 62c are connected by using two connection methods. That is, all of the source electrodes of the inspection circuit thin-film transistors that are connected to the data signal line connection wires 62a that have odd numbers counted from an end are connected to the wire 62g. All of the source electrodes of the inspection circuit thin-film transistors that are connected to the data signal line connection wires 62a that have even numbers are connected to the wire 62h.

Accordingly, a short circuit of the adjacent data signal line connection wires 62a (the data signal lines 62), for example, can be inspected in a manner in which all of the inspection circuit thin-film transistors that are located in the data signal line inspection circuit 62c are turned ON by using the wire 62f, and the wire 62g and the wire 62h are freely energized in turn.

That is, a short circuit, disconnection of a wire that the display panel 100 includes, the presence or absence of a pixel failure, and the quality of display can be inspected in a manner in which the divided common electrodes 41 are energized by using the gate driver 31, the RGB switch circuit 35, and divided common electrode terminals 41a described later, and the data signal line inspection circuit 62c described above is energized.

Divided Common Electrode Wire Inspection Circuit 71b

According to the first embodiment, as illustrated in FIG. 3, a divided common electrode wire inspection circuit 71b (referred to below as an "inspection circuit 71b") is disposed between the wires 71 (the divided common electrode wires) and the divided common electrode terminals 41a right below the common electrode driver IC 36. The inspection circuit 71b functions as an inspection circuit instead of the common electrode driver IC 36. That is, the inspection circuit 71b is provided to inspect a short circuit and disconnection in a manner in which the wires 71 are energized by using the inspection circuit 71b, potential is applied to the divided common electrodes 41, and an image that is displayed on the screen of the display panel 100 is observed during a simple inspection that is carried out before the circuit member such as the driver IC is mounted on the display panel 100.

The inspection circuit 71b includes divided common electrode wire inspection switch elements 71d (thin-film transistors) the number of which is equal to that of the wires 71 (the wires 71a) and divided common electrode inspection circuit control wires 71e, 71f, and 71g (referred to below as "wires 71e, 71f, and 71g"). The wires 71e, 71f, and 71g extend to the divided common electrode wire inspection circuit terminals 71c that are disposed on the surface of the edge portion 12 of the first substrate 10 that faces the second substrate 20.

The inspection circuit 71b will be further described in detail. A single inspection circuit thin-film transistor is provided for each wire 71. All of gate electrodes of the thin-film transistors are connected to the single wire 71e. When the display panel 100 is inspected, all of the inspection circuit thin-film transistors are turned ON by energizing the gate electrodes by using the single wire 71e.

The thin-film transistors that are located in the inspection circuit 71b are turned ON only during inspection and to be kept OFF after mounting ends, and the product is obtained. In view of this, it is preferable that a wire be formed by extending an end of the wire 71e and connected to the divided common electrode wire inspection switch element blockage terminal 71h that is disposed on the surface of the edge portion 12 of the first substrate 10 that faces the second substrate 20, and OFF potential be continuously applied to the terminal. The second FPC 34 is mounted on the edge portion 12 (the mounting region R3b). Accordingly, in the case where there is a terminal to which fixed potential is to be continuously applied, the terminal to which the fixed potential is to be continuously applied may be disposed at the edge portion 12, and the OFF potential may be applied via the second FPC 34.

Source electrodes of the inspection circuit thin-film transistors are connected by using two connection methods. That is, the source electrode 63a of the inspection circuit thin-film transistor that is connected to one of the divided common electrodes 41 (the wires 71) adjacent to each other in the pixel region R1 is connected to the wire 71f. The source electrode 63a of the inspection circuit thin-film transistor that is connected to the other of the divided common electrodes 41 (the wires 71) adjacent to each other in the pixel region R1 is connected to the wire 71g.

Accordingly, the divided common electrodes 41 can be energized in turn in a checkered pattern in a manner in which all of the inspection circuit thin-film transistors that are located in the divided common electrode wire inspection circuit 71b are turned ON by using the wire 71e, and the wire 71f and the wire 71g are freely energized in turn. Accordingly, a short circuit and disconnection of the divided common electrodes 41 (the wires 71) can be inspected.

That is, data signal line disconnection, a short circuit, the presence or absence of a pixel failure, and the quality of display, not to mention the inspection of the wires 71 that are included in the display panel 100, can be inspected in a manner in which the gate driver 31, the RGB switch circuit 35, and the data signal line inspection circuit 62c are energized, and the divided common electrodes 41 are energized by using the inspection circuit 71b described above.

Data Signal Line Connection Wire 62a

Figure 6:
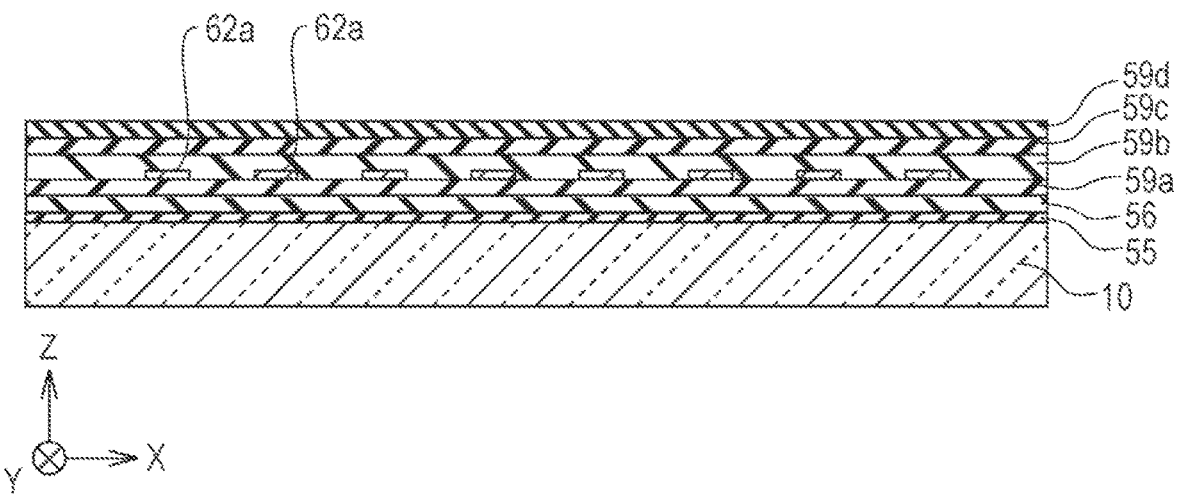
FIG. 6 is a sectional view taken along line VI-VI in FIG. 5.

FIG. 6 is a sectional view of the display panel 100 where the data signal line connection wires 62a according to the first embodiment are disposed. FIG. 6 illustrates the sectional view taken along line VI-VI in FIG. 3 and FIG. 5.

As for the display panel 100 according to the present disclosure, the data signal line connection wires 62a mean wires that connect the data signal terminals 62b and the data signal lines 62 in the pixel region R1 to each other and that extend over the whole or freely-selected partial sections of the wiring paths. Accordingly, in the case where the RGB switch circuit 35, for example, is disposed near the pixel region R1, the data signal line connection wires 62a can be wires that connect the RGB switch circuit 35 and the data signal terminals 62b to each other. In the case where the data signal line inspection circuit 62c is disposed in a region between the RGB switch circuit 35 and the data signal terminals 62b, the data signal line connection wires 62a can be wires that connect the RGB switch circuit 35 and the data signal line inspection circuit 62c to each other. The data signal line connection wires 62a can be wires that connect the data signal line inspection circuit 62c and the data signal terminals 62b to each other. In a certain condition, the data signal line connection wires 62a can be wires that extend across a circuit region.

In the display panel 100 according to the first embodiment, as illustrated in FIG. 5, the data signal line connection wires 62a are composed of the same conductive film (the second conductive film) as the data signal lines 62. The whole of the data signal line connection wires 62a is patterned into a sectorial shape by using the second conductive film in a plane above the first substrate 10 such that a distance D12 between second ends of the multiple data signal line connection wires 62a that are located near the data signal terminals 62b is smaller than a distance D11 between first ends of the multiple data signal line connection wires 62a that are located near the pixel region R1. In FIG. 5, the multiple data signal terminals 62b are illustrated as a single block to make the description easy.

As illustrated in FIG. 3, the first ends of the data signal line connection wires 62a near the pixel region R1 are set in substantially uniform ranges from the central axis (the axis along the Y-axis) of the pixel region R1 to the left and right. The second ends of the data signal line connection wires 62a near the data signal terminals 62b are set in substantially uniform ranges from the central axis (the axis along the Y-axis) of the pixel region R1 to the left and right.

As illustrated in FIG. 5, a region that is occupied by the multiple data signal line connection wires 62a and a region that is occupied by the multiple wires 71a do not overlap in a plan view, and accordingly, there is no capacitance due to overlapping of connection wires with an insulating film interposed therebetween. Accordingly, the load of the data signal line connection wires 62a decreases, the data signal line connection wires 62a that are thinned can be used.

Consequently, the efficiency of wiring layout of the data signal line connection wires 62a in the sectorial shape is increased, and the size of the region that is occupied by the data signal line connection wires 62a can be decreased. Accordingly, the size of the frame of the display panel 100 near the edge portion 11 can be decreased.

Divided Common Electrode Wire Connection Wire 71a

Figure 7:
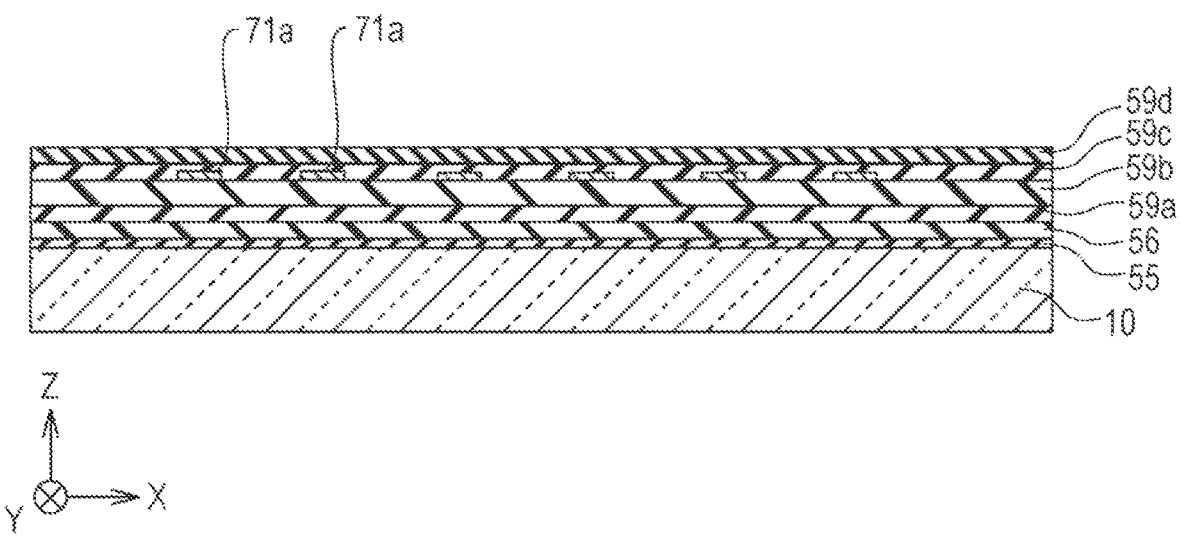
FIG. 7 is a sectional view taken along line VII-VII in FIG. 5.

FIG. 7 illustrates sections of the divided common electrode wire connection wires (the wires 71a) according to the first embodiment. FIG. 7 is a sectional view taken along line VII-VII in FIG. 3 and FIG. 5.

In the display panel 100 according to the present disclosure, as illustrated in FIG. 5, the wires 71a mean wires that connect the divided common electrode terminals 41a and the wires 71 in the pixel region R1 to each other and that extend over the whole or freely-selected partial sections of the wiring paths. Accordingly, for example, in the case where the inspection circuit 71b is disposed in a region between the pixel region R1 and the divided common electrode terminals 41a and near the pixel region R1, the wires 71a can be wires that connect the inspection circuit 71b and the divided common electrode terminals 41a to each other. In the case where the inspection circuit 71b is disposed at a position away from the pixel region R1, the wires 71a can be wires that connect the inspection circuit 71b and end portions of the wires 71 in the pixel region R1. In a certain condition, the wires 71 can be wires that extend across the circuit region.

In the display panel 100 according to the first embodiment, the wires 71a are composed of the same conductive film (the third conductive film) as the wires 71. The whole of the wires 71a is patterned into a sectorial shape by using the third conductive film in a plane above the first substrate 10 such that a distance D22 between second ends of the multiple wires 71a that are located near the divided common electrode terminals 41a is smaller than a distance D21 between first ends of the multiple wires 71a that are located near the pixel region R1. In FIG. 5, the multiple divided common electrode terminals 41a are illustrated as a single block to make the description easy.

As illustrated in FIG. 3, the first ends of the wires 71a near the pixel region R1 are set in substantially uniform ranges from the central axis (the axis along the Y-axis) of the pixel region R1 to the left and right. The second ends of the wires 71a near the divided common electrode terminals 41a are set in substantially uniform ranges from the central axis (the axis along the Y-axis) of the pixel region R1 to the left and right.

As illustrated in FIG. 5, a region that is occupied by the wires 71a and a region that is occupied by the data signal line connection wires 62a do not overlap in a plan view, and accordingly, there is no capacitance due to overlapping of connection wires with an insulating film interposed therebetween. Accordingly, the load of the wires 71a decreases, and the wires 71a that are thinned can be used.

Consequently, the efficiency of wiring layout of the wires 71a in the sectorial shape is increased, and the size of the region that is occupied by the wires 71a can be decreased. Accordingly, the size of the frame of the display panel 100 near the edge portion 12 can be decreased.

As illustrated in FIG. 1, the display panel 100 may have process management marks 80 such as a positioning mark, an identification symbol, and a barcode in free regions of the edge portion 11 and the edge portion 12. The process management marks 80 may be concentrated on any one of sides or may disperse. In the case of the display panel 100 that has a circular shape (an atypical form), positioning is likely to be difficult when the polarizer is attached. In consideration for this, positioning marks may be located at three or more positions by using the edge portion 11 and the edge portion 12.

Comparison Between First Embodiment and Comparative Example

Comparison between an active matrix substrate 500 in a comparative example and the first embodiment will be described. The description and illustration of the active matrix substrate 500 in the comparative example are provided to describe the actions and effects according to the first embodiment, and the structure of the active matrix substrate 500 in the comparative example is not admitted as a related art.

Figure 8:
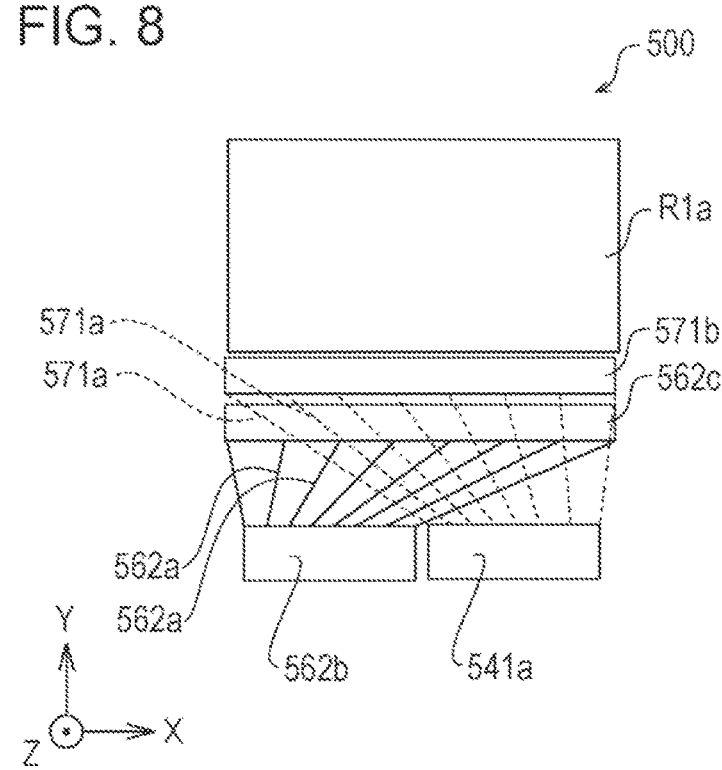
FIG. 8 is a plan view for description of a comparative example.

In the description below, a plan view of the active matrix substrate 500 in the comparative example in FIG. 8 is used. In FIG. 8, some of components that are included in the active matrix substrate 500 are omitted.

A circuit 562c corresponds to the data signal line inspection circuit 62c, a circuit 571b corresponds to the inspection circuit 71b, and the circuits 562c and 571b are disposed away from a pixel region R1a in the negative direction of the Y-axis. Data signal terminals 562b and divided common electrode terminals 541a are disposed away from the pixel region R1a in the negative direction of the Y-axis. Data signal line connection wires 562a and divided common electrode wire connection wires 571a are formed away from the pixel region R1a in the negative direction of the Y-axis. However, the data signal terminals 562b and the divided common electrode terminals 541a have different functions. Accordingly, for example, the data signal terminals 562b are disposed away from the Y-axis that is the center of the pixel region R1a in the negative direction of an X-axis. The divided common electrode terminals 541a are disposed away from the Y-axis that is the center of the pixel region R1a in the positive direction of the X-axis.

Consequently, the data signal line connection wires 562a extend so as to form a sectorial shape biased in the negative direction of the X-axis. That is, if an angle of the direction in which the data signal line connection wire 562a that is located in the positive direction of the X-axis (that has the maximum wire length) obliquely extends does not change, the size of an edge portion of the active matrix substrate 500 needs to be increased to connect the data signal line connection wire 562a to the data signal terminal 562b that is disposed at a farther position that shifts to the left of the paper, and consequently, the size of the frame of the active matrix substrate 500 increases.

Similarly, the wires 571a extend so as to form a sectorial shape biased in the positive direction of the X-axis. That is, if an angle of the direction in which the wire 571a that is located in the negative direction of the X-axis (that has the maximum wire length) obliquely extends does not change, the size of the edge portion of the active matrix substrate 500 needs to be increased to connect the wire 571a to the divided common electrode terminal 541a that is disposed at a farther position that shifts to the right of the paper, and consequently, the size of the frame of the active matrix substrate 500 increases.

As illustrated in FIG. 8, the data signal line connection wires 562a and the wires 571a overlap with an insulating film interposed therebetween in a plan view, and accordingly, there is capacitance at an overlapping position. Consequently, the load of the connection wires increases and leads to non-uniform display and unstable touch detection.

Second Embodiment

Figure 9:
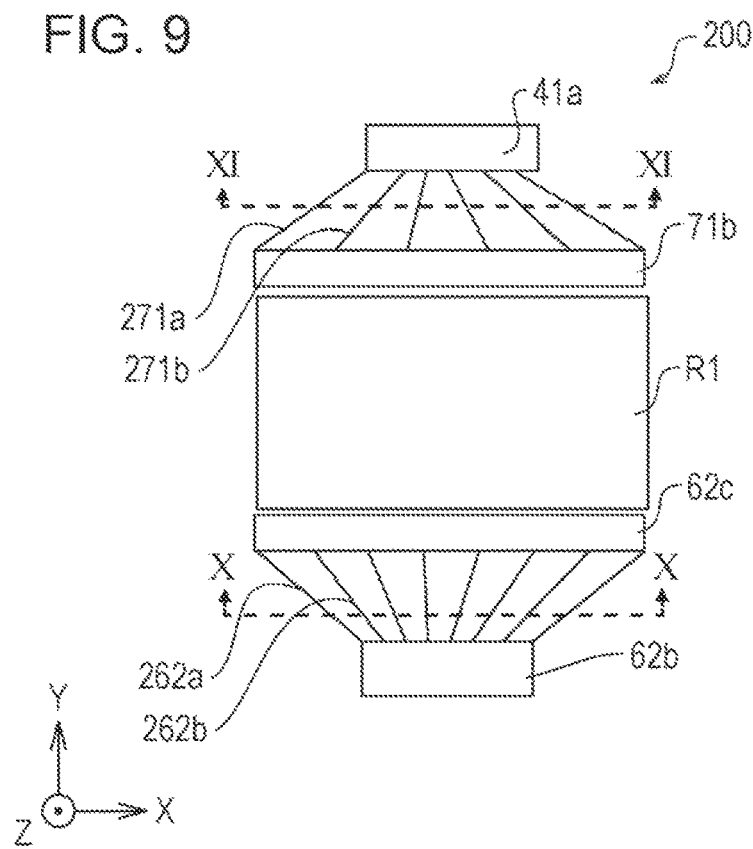
FIG. 9 is a plan view of an active matrix substrate according to a second embodiment.
Figure 10:
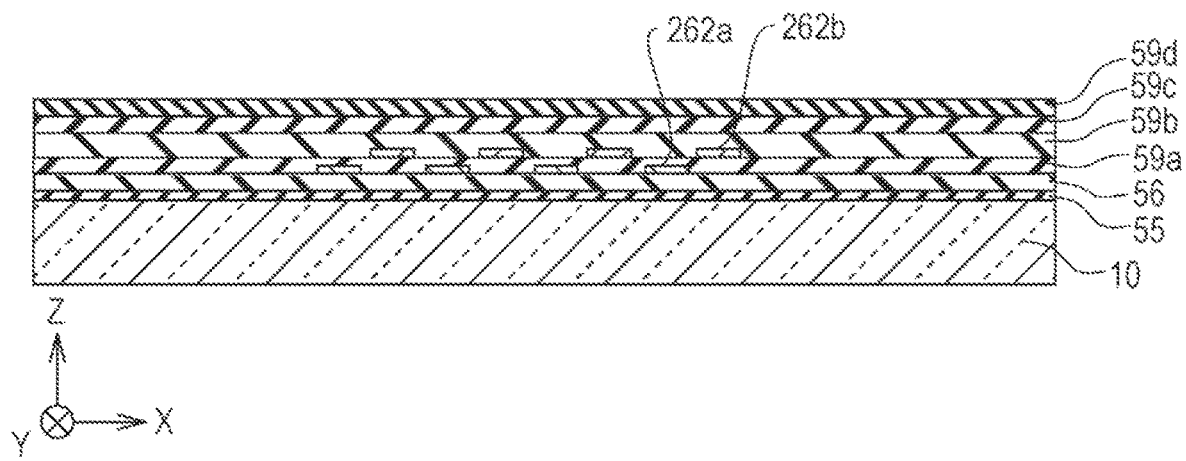
FIG. 10 is a sectional view taken along line X-X in FIG. 9.
Figure 11:
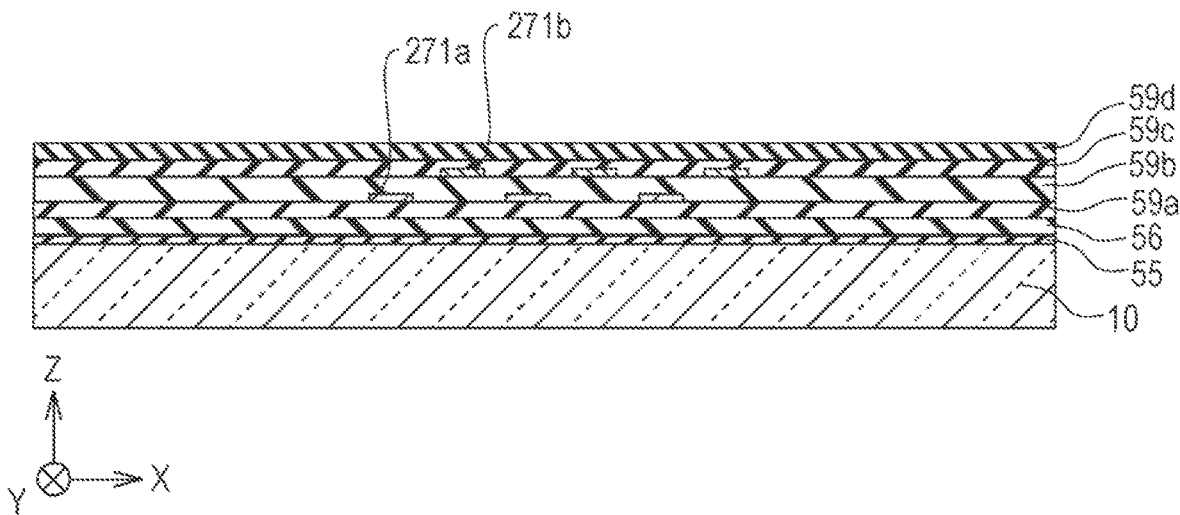
FIG. 11 is a sectional view taken along line XI-XI in FIG. 9.

A second embodiment will now be described. In the case where reference signs like to those according to the first embodiment are used in the following description, components like to those according to the first embodiment are designated by the reference signs and are referred to by the above description unless otherwise particularly described. FIG. 9 is a schematic plan view of a display panel 200 according to the second embodiment. FIG. 10 is a sectional view taken along line X-X in FIG. 9. FIG. 11 is a sectional view taken along line XI-XI in FIG. 9. The pixel region R1 is illustrated as a rectangle for convenience. An illustration of the gate driver 31 and the RGB switch circuit 35, for example, is omitted.

According to the second embodiment, the content of conductive films of which data signal line connection wires 262a and 262b and wires 271a and 271b are composed is changed from that in the case of the data signal line connection wires 62a and the wires 71a according to the first embodiment.

Data Signal Line Connection Wires 262a and 262b

According to the second embodiment, as illustrated in FIG. 10, the total number of the data signal line connection wires 262a and 262b is equal to the number of the data signal line connection wires 62a according to the first embodiment, but patterning is performed by using two kinds of conductive films. Specifically, the data signal line connection wires 262a that have odd numbers counted are patterned by using the first conductive film, and the data signal line connection wires 262b that have even numbers counted are patterned by using the second conductive film.

This enables distances between the data signal line connection wires 262a and 262b to be decreased. The data signal line connection wires 262a and 262b are electrically separated from each other with the insulating film 59a interposed therebetween, and accordingly, a short circuit failure is inhibited, and the data signal line connection wires 262a and 262b that have narrow pitches can be constituted. Consequently, the size of the frame near the edge portion 11 can be decreased.

The materials of two adjacent data signal line connection wires of the data signal line connection wires 262a and 262b are not limited to the two kinds of the conductive films described above. For example, the data signal line connection wires 262a composed of the second conductive film and the data signal line connection wires 262b composed of the third conductive film may be adjacent to each other. Alternatively, the data signal line connection wires 262a composed of the third conductive film and the data signal line connection wires 262b composed of the first conductive film may be adjacent to each other. Furthermore, three adjacent data signal line connection wires may be a data signal line connection wire composed of the first conductive film, a data signal line connection wire composed of the second conductive film, and a data signal line connection wire composed of the third conductive film. That is, one of two adjacent data signal line connection wires can be composed of the first conductive film, the second conductive film, or the third conductive film, and the other can be composed of a conductive film that differs from the conductive film of which the one is composed among the first conductive film, the second conductive film, and the third conductive film.

Divided Common Electrode Wire Connection Wires 271a and 271b

The wires 271a and 271b according to the second embodiment will now be described with reference to FIG. 11. According to the second embodiment, the total number of the wires 271a and 271b is equal to the number of the wires 71a according to the first embodiment, but patterning is performed by using two kinds of conductive films. Specifically, the wires 271a that have odd numbers counted are patterned by using the second conductive film, and the wires 271b that have even numbers counted are patterned by using the third conductive film.

This enables distances between the wires to be decreased without decreasing the line widths of the wires 271a and 271b. Two adjacent wires of the wires 271a and 271b are electrically separated from each other with the insulating film 59b interposed therebetween, and accordingly, a short circuit failure is inhibited, and the wires 271a and 271b that have narrow pitches can be constituted. Consequently, the size of the frame near the edge portion 12 can be decreased.

The materials of two adjacent wires of the wires 271a and 271b are not limited to the two kinds of the conductive films described above. For example, the wires 271a composed of the third conductive film and the wires 271b composed of the first conductive film may be adjacent to each other. Alternatively, the wires 271a composed of the first conductive film and the wires 271b composed of the second conductive film may be adjacent to each other. Furthermore, three adjacent wires may be a wire composed of the first conductive film, a wire composed of the second conductive film, and a wire of the third conductive film. That is, one of two adjacent wires can be composed of the first conductive film, the second conductive film, or the third conductive film, and the other can be composed of a conductive film that differs from the conductive film of which the one is composed among the first conductive film, the second conductive film, and the third conductive film.

Third Embodiment

Figure 12:
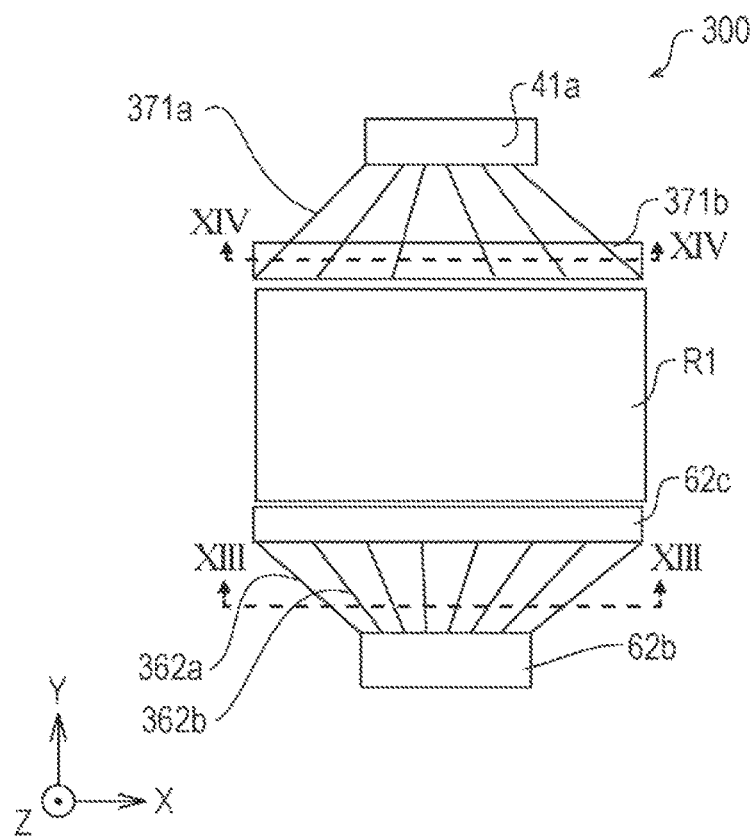
FIG. 12 is a plan view of an active matrix substrate according to a third embodiment.
Figure 13:
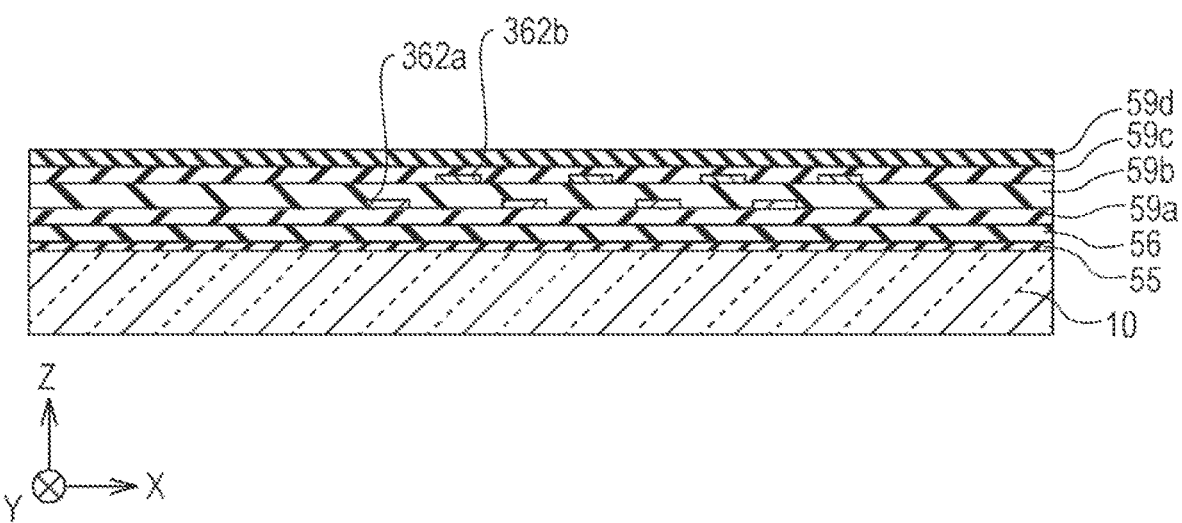
FIG. 13 is a sectional view taken along line XIII-XIII in FIG. 12.
Figure 14:
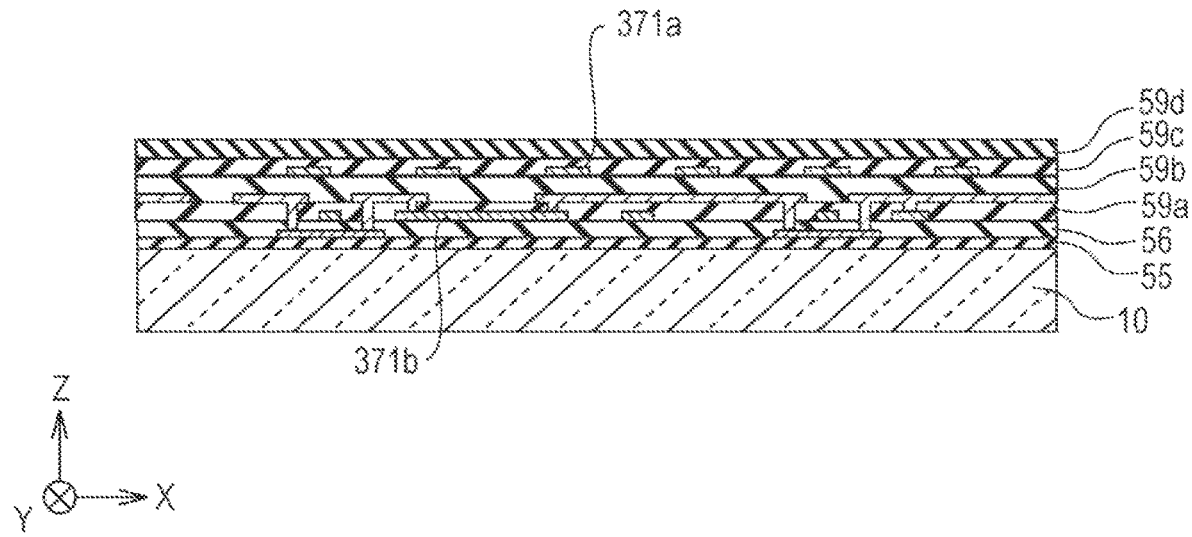
FIG. 14 is a sectional view taken along line XIV-XIV in FIG. 12.

A third embodiment will now be described. In the case where reference signs like to those according to the first or second embodiments are used in the following description, components like to those according to the first or second embodiments are designated by the reference signs and are referred to by the above description unless otherwise particularly described. FIG. 12 is a schematic plan view of a display panel 300 according to the third embodiment. FIG. 13 is a sectional view taken along line XIII-XIII in FIG. 12. FIG. 14 is a sectional view taken along line XIV-XIV in FIG. 12. The pixel region R1 is illustrated as a rectangle for convenience. An illustration of the gate driver 31 and the RGB switch circuit 35, for example, is omitted.

The third embodiment differs from the first embodiment in a conductive film of which data signal line connection wires 362a and 362b are composed and a conductive film of which wires 371a are composed. The wires 371a and a circuit 371b overlap with the insulating film 59b interposed therebetween. The function of the circuit 371b is the same as that of the inspection circuit 71b.

Data Signal Line Connection Wires 362a and 362b

According to the third embodiment, as illustrated in FIG. 13, the number of the data signal line connection wires 362a and 362b is equal to the number of the wires 62a according to the first embodiment, but patterning is performed by using two kinds of conductive films. Specifically, the data signal line connection wires 362a that have odd numbers counted are patterned by using the second conductive film, and the data signal line connection wires 362b that have even numbers counted are patterned by using the third conductive film. This enables the same actions and effects as those of the data signal line connection wires 262a and 262b according to the second embodiment described above to be achieved.

Divided Common Electrode Wire Connection Wire 371a

According to the third embodiment, the divided common electrode wire connection wires (the wires 371a) are patterned by using the third conductive film. The wires 371a overlap the circuit 371b that is disposed outside the circumference of the pixel region R1 (the mounting region) with the insulating film 59b interposed therebetween.

The circuit 371b is a circuit that uses the semiconductor layer, the first conductive film, the second conductive film, and insulating films below the insulating film 59b. An example of the circuit 371b is the divided common electrode wire inspection circuit described with reference to FIG. 3. Accordingly, the third conductive film may not be provided to constitute the circuit 371b, provided that wires are split from the respective wires 371a and are connected to the drain electrodes of the thin-film transistors that are to be divided common electrode wire inspection switches.

The wires 371a can be stretched in an upper layer on the circuit 371b in a manner in which the wires 371a are composed of the third conductive film. In the region of the circuit 371b, the wires 371a composed of the third conductive film may extend obliquely at angles with respect to the arrangement direction of the circuit 371b to obtain the wires 371a in a sectorial shape. Consequently, the region that is on the first substrate and that is used as the wires 371a that have the layout of the sectorial shape can be substantially narrowed, and the size of the frame of the edge portion 12 of the display panel 300 that uses the first substrate can be decreased.

Fourth Embodiment

Figure 15:
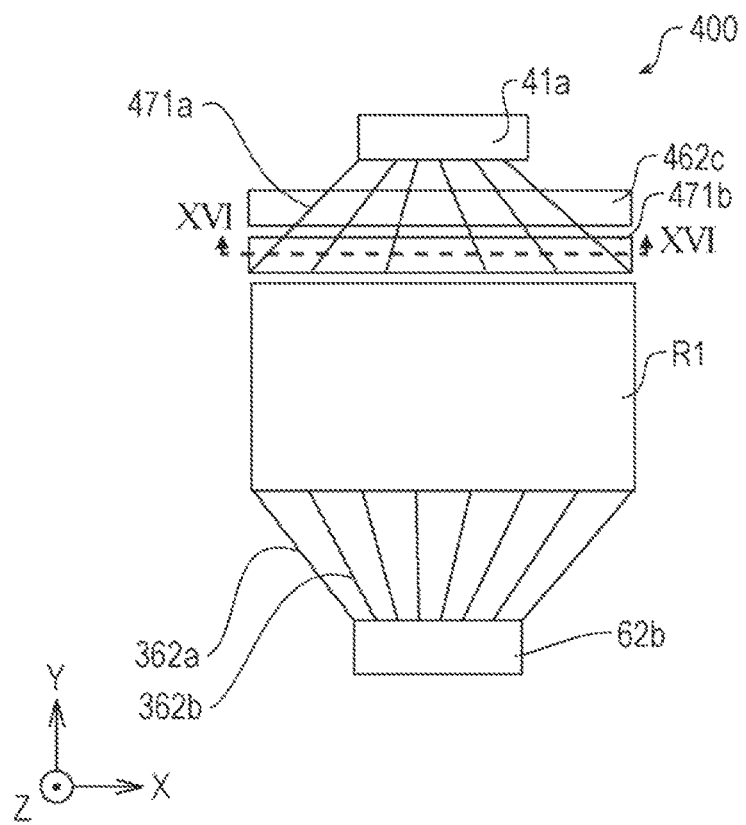
FIG. 15 is a plan view of an active matrix substrate according to a third embodiment.
Figure 16:
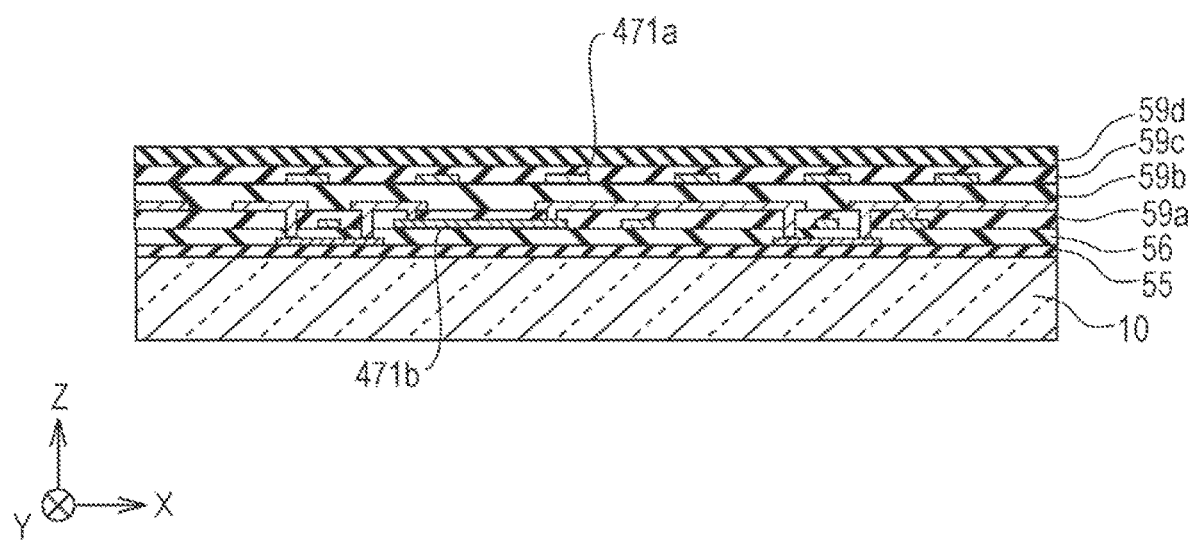
FIG. 16 is a sectional view taken along line XVI-XVI in FIG. 15.

A fourth embodiment will now be described. In the case where reference signs like to those according to the first to third embodiments are used in the following description, components like to those according to the first to third embodiments are designated by the reference signs and are referred to by the above description unless otherwise particularly described. FIG. 15 is a schematic plan view of a display panel 400 according to the fourth embodiment. FIG. 16 is a sectional view taken along line XVI-XVI in FIG. 15. The pixel region R1 is illustrated as a rectangle for convenience. An illustration of the gate driver 31 and the RGB switch circuit 35, for example, is omitted.

The arrangement of components that are formed on the first substrate according to the fourth embodiment is basically the same as that according to the third embodiment described above, but there are two differences. A circuit 462c has the same function as that of the data signal line inspection circuit 62c. A circuit 471b has the same function as that of the inspection circuit 71b. The circuit 462c is disposed away from the circuit 471b in the positive direction of the Y-axis. That is, the pixel region R1, the circuit 471b, and the circuit 462c are disposed in this order when viewed from the pixel region in the Y-direction. The second point is that wires 471a overlap the circuit 471b with the insulating film 59b interposed therebetween, and the wires 471a overlap the circuit 462c with the insulating film 59b interposed therebetween.

As illustrated in FIG. 15, the data signal terminals 62b are disposed opposite the circuit 462c with the pixel region R1 interposed therebetween. Accordingly, drain electrodes of thin-film transistors that are to be data signal line inspection switch elements that are included in the circuit 462c need to be connected to the data signal lines. The number of the data signal lines 62 is typically three times the number of the data signal line connection wires 62a. For this reason, according to the fourth embodiment, the number of the data signal line inspection switch elements (not illustrated) is three times the number in the structure in FIG. 3.

Divided Common Electrode Wire Connection Wire 471a

According to the fourth embodiment, as illustrated in FIG. 16, the wires 471a are patterned by using the third conductive film. The wires 471a overlap the circuits 462c and 471b with the insulating film 59b interposed therebetween. The circuit 471b is a circuit that uses insulating films below the semiconductor layer, the first conductive film, the second conductive film, and the insulating film 59b. The circuits 462c and 471b typically correspond to the divided common electrode wire inspection circuit described with reference to FIG. 3. Accordingly, the third conductive film may not be provided to constitute the circuit 71b in FIG. 3, that is, the circuit 471b in FIG. 16, provided that wires are split from the respective divided common electrode wires and are connected to the drain electrodes of the thin-film transistors that are to be the divided common electrode wire inspection switches.

The circuit 462c is a circuit that uses the insulating films below the semiconductor layer, the first conductive film, the second conductive film, and the insulating film 59b. The circuit 462c is an inspection circuit related to the data signal lines 62 and is electrically separated from the divided common electrodes (the wires 471a). Accordingly, the third conductive film may not be provided to constitute the circuit 462c. Accordingly, the wires 471a can be stretched in an upper layer on the circuit 471b and in an upper layer on the circuit 462c in a manner in which the wires 471a are composed of the third conductive film. In the region of the circuit 471b, the region of the circuit 462c, or both regions, the wires 471a composed of the third conductive film may extend obliquely at angles with respect to the arrangement direction of the circuit 471b and the circuit 462c to obtain the wires 471a in a sectorial shape. Consequently, the region that is on the first substrate and that is used as the wires 471a that have the layout of the sectorial shape can be substantially narrowed, and the size of the frame of the edge portion 12 of the display panel 400 that uses the first substrate can be decreased.

The embodiments are described above, but the embodiments described above are examples for carrying out the present disclosure. Accordingly, the present disclosure is not limited to the embodiments described above, and the embodiments described above can be appropriately modified and carried out without departing from the spirit thereof.

(A) The shape of the pixel region R1 may not be circular. For example, the shape may be elliptic or polygonal. The shape may be rectangular although the product may have poor aesthetic design.

(B) The external form of a display panel may not be obtained by partly cutting a circle. For example, the external form may be obtained by partly cutting an ellipse or a polygon. The external form may be obtained by combining three or more sides and three or more curves contained in an imaginary circle. The external form may be a square or a rectangle contained in an imaginary circle. In the case where the first substrate 10 (the active matrix substrate) has at least two or more mounting sides that have shapes set based on such a shape, and attention is paid to the mounting regions, the effects of the present disclosure can be achieved particularly when the length (the length L21 of the edge portion 21 in FIG. 1) of a side of the second substrate 20, or the length of a boundary line that defines each mounting region if there is no second substrate, is longer than the length (the length L11 of the edge portion 11 in FIG. 2) of a side of the first substrate at a first end, and when the length (the length L22 of the edge portion 22 in FIG. 1) of a side of the second substrate 20, or the length of the boundary line that can define each mounting region if there is no second substrate, is longer than the length (the length L12 of the edge portion 12 in FIG. 1) of a side of the first substrate 10 at a second end.

(C) The structures of the mounting regions may not be based on a so-called COG method. For example, the structures may be based on a COF method. The COG method may be used for one of the mounting regions, and the COF method may be used for the other the mounting region.

(D) The orientation of each edge portion is not limited. In the structure described with reference to in FIG. 1 and FIG. 3 according to the present disclosure, the edge portion 11 (the edge portion 21) and the edge portion 12 (the edge portion 22) are parallel to each other but may not be parallel and an angle may be made therebetween. That is, the positions of one of the sides and the other side are set such that the region that is occupied by one of the connection wires in connection wire regions that have different functions and the region that is occupied by the other connection wire are inhibited from overlapping as much as possible. The number of the edge portion on which the data signal terminals 62b are disposed may not be equal to the number of the edge portion on which the divided common electrode terminals 41a are disposed. For example, the data signal terminals 62b may be disposed at two edge portions, and the divided common electrode terminals 41a may be disposed at the single edge portion.

(E) The distance between the edge portion 11 and the edge portion 21 and the distance between the edge portion 12 and the edge portion 22 can be freely set depending on a mounting method or the dimensions of short sides of the driver IC to be loaded. The distance between the edge portion 11 and the edge portion 21 and the distance between the edge portion 12 and the edge portion 22 may be equal to each other or may differ from each other.

(F) The gate driver 31 may be disposed on both sides of the pixel region R1. The wires 71a may be disposed in an upper layer in the region of the gate driver 31 with an insulating film interposed therebetween.

(G) The RGB switch circuit 35 may not be provided, and the data signal terminals 62b and end portions of the data signal lines 62 in the pixel region R1 may be directly connected to the data signal line connection wires 62a. The wires 71a may be disposed in an upper layer on the RGB switch circuit 35 with an insulating film interposed therebetween.

(H) The inspection terminals may be concentratedly disposed at the edge portion 11 and the edge portion 12. Inspection terminals may be dispersedly disposed at the edge portion 11 and the edge portion 12.

(I) The model numbers of the data signal driver IC 32 and the common electrode driver IC 36 may differ from each other. A single driver IC that has a function of outputting all signals and that has changed settings may be disposed on the first substrate 10 and may be used as the data signal driver IC 32 and the common electrode driver IC 36.

(J) In order to supply power used to drive the data signal driver IC 32 and the common electrode driver IC 36 and to synchronize the drivers IC, a wire that extends from one of the edge portions to the other edge portion via the region (the frame region R2) of the first substrate 10 that is covered by the second substrate 20 can be provided, and the data signal driver IC 32 and the common electrode driver IC 36 can be connected to each other with the wire interposed therebetween. Since the wire is covered by the second substrate 20, the wire can be inhibited from being mechanically broken from the outside and inhibited from being corroded due to external environment.

(K) A fourth conductive film may be prepared. For example, according to the fourth embodiment, the fourth conductive film that is formed so as to interpose an insulating film between the fourth conductive film and the third conductive film may be prepared, the wires 471a that are disposed in the upper layer on the circuit 462c and the circuit 471*b* may be wires such that a wire composed of the third conductive film and a wire composed of the fourth conductive film are adjacent to each other. In the case where the wire composed of the fourth conductive film does not overlap the circuits, the data signal line connection wires 62*a* or the wires 71*a* can be wires composed of at least one of the first, second, third, and fourth conductive films. As for the data signal line connection wires 62*a* or the wires 71*a*, adjacent wires thereof can be such that wires that are composed of different conductive films are adjacent to each other in a manner in which at least two of the first, second, third, and fourth conductive films are used.

(L) The scanning signal line connection wires 61*a* that connect the gate driver 31 and the scanning signal lines 61 to each other are not limited by patterning by using the same conductive film as the scanning signal lines 61. That is, the scanning signal line connection wires 61*a* can be wires that are composed of at least one of the first, second, third, and fourth conductive films. The scanning signal line connection wires 61*a* that are composed of different conductive films and that are adjacent to each other can be obtained in a manner in which freely selected adjacent wires that are included in the scanning signal line connection wires 61*a* are composed of at least two of the first, second, third, and fourth conductive films.

(M) The inspection circuit 71*b* may be disposed in a region near the data signal terminals 62*b* outside the circumference of the pixel region R1.

(N) The circuits that are disposed outside the circumference of the pixel region R1 are not limited by a structure that includes a semiconductor layer such as the gate driver 31, the RGB switch circuit 35, the data signal line inspection circuit 62*c*, and the inspection circuit 71*b*. For example, an auxiliary wire that is prepared for disconnection and that is composed of the first conductive film or the second conductive film, and an array of a melt portion obtained by intersection of the data signal lines 62, an insulating film, and the auxiliary wire may be disposed outside the circumference of the pixel region R1. According to the present disclosure, the auxiliary wire and the melt portion are objects that are called circuits.

(O) As for each circuit that is disposed around the pixel region R1, the length of the circuit in the arrangement direction may be shorter than the dimension of a circuit in the pixel region R1 in the arrangement direction. The circuit may not be linearly disposed but may be disposed along the edge of the pixel region R1 so as to have a freely determined arc shape or a curved shape. The circuit may be divided into multiple blocks, the blocks may be disposed stepwise along the edge of the pixel region R1, and the blocks may be connected to each other with a predetermined wire.

(P) Dummy pixels may be disposed around the pixel region R1. These does not contribute to image display and are disposed in a covered region of the black matrix of the frame. The wires 71*a* according to the present disclosure may overlap right above the dummy pixels with an insulating film interposed therebetween. The wires 71*a* may overlap obliquely with respect to the dummy pixels in a plan view.

(Q) The data signal lines 62 and the divided common electrode wires may include protection circuits for protecting the circuits and the wires from being broken due to static electricity. For example, each protection circuit includes a thin-film transistor, a capacitor that has a parallel flat plate shape, a diode, a resistor that are freely selected. The protection circuits correspond to a circuit that is disposed at an outer circumferential portion around the pixel region R1 described according to the present disclosure.

(R) A display panel may not include the second substrate 20. For example, a film for protection, for example, may be attached instead of the second substrate 20. In the case where there is not the second substrate 20, there are neither the edge portion 21 nor the edge portion 22 that correspond to end portions in the mounting regions R3. Even in this case, boundaries corresponding to the sides thereof can be imaginarily set on a surface of the first substrate 10 such that a freely selected location between the data signal terminals 62*b* and end portions of the data signal lines 62 facing the data signal terminals 62*b* is regarded as the edge portion 21, and a freely selected location between the divided common electrode terminals 41*a* and end portions of the divided common electrode wires facing the divided common electrode terminals is regarded as the edge portion 22. Accordingly, the structures described according to the present disclosure can be used, and the effects and actions thereof can be achieved. Such a display panel that does not include the second substrate 20 is a target of the present disclosure.

(S) In an example described above, the active matrix substrate has the function of detecting a touch. The present disclosure, however, is not limited thereto. That is, the targets of the present disclosure include an active matrix substrate that does not have the function of detecting a touch. For example, an active matrix substrate (a display panel) may be configured such that the whole of the screen (all of the divided common electrodes) are not at all times driven, but an image is displayed by energizing some of the divided common electrodes. That is, a display driver IC that is connected to the divided common electrode wire connection wires may be disposed in the mounting region R3*b* instead of the common electrode driver IC 36 (the touch detection driver IC) for touch detection. In the case where such an active matrix substrate (a display panel) includes a backlight that can freely adjust a range that can be illuminated, the backlight can illuminate only a range corresponding to the range of the divided common electrodes that are driven, and accordingly, power consumption can be reduced.

The active matrix substrate and the display panel described above can be described as follows.

An active matrix substrate with a first structure is an active matrix substrate that has a pixel region and that includes multiple pixels that are disposed in the pixel region, The active matrix substrate includes multiple scanning signal lines, multiple data signal lines that intersect the multiple scanning signal lines, multiple switching elements that are disposed at respective multiple intersecting portions of the multiple data signal lines and the multiple scanning signal lines, multiple pixel electrodes that are connected to the respective multiple switching elements, a common electrode that is disposed in the pixel region, the common electrode including multiple divided common electrodes that are divided in a matrix, multiple divided common electrode wires that are connected to the respective multiple divided common electrodes and that are disposed in the pixel region, multiple data signal terminals that are disposed at a first end portion of the active matrix substrate, divided common electrode terminals that are disposed at a second end portion that differs from the first end portion of the active matrix substrate, multiple data signal line connection wires that connect the multiple data signal lines and the multiple data signal terminals to each other, and multiple divided common electrode wire connection wires that connect the multiple divided common electrode wires and the multiple divided common electrode terminals to each other. A distance between end portions of the multiple data signal line connection wires facing the multiple data signal terminals is shorter than a distance between end portions of the multiple data signal line connection wires facing the pixel region. A distance between end portions of the multiple divided common electrode wire connection wires facing the divided common electrode terminals is shorter than a distance between end portions of the multiple divided common electrode wire connection wires facing the pixel region (the first structure).

With the first structure described above, the multiple data signal line connection wires are disposed at the first end portion of the active matrix substrate, and the multiple divided common electrode wire connection wires are disposed at the second end portion. That is, the mounting regions can be separated between two end portions (for example, both of the end portions) of the active matrix substrate. Consequently, the terminals that are connected to the multiple data signal line connection wires and the terminals that are connected to the multiple divided common electrode wire connection wires can be disposed at central portions in the respective mounting regions (the end portions). As for the distances between the ends of the multiple data signal line connection wires and the distances between the ends of the multiple divided common electrode wire connection wires, distances between distal ends from the pixel region are shorter than distances between proximal ends from the pixel region. Accordingly, the lengths of the edge portions that constitute the mounting regions can be decreased. In the case where the display panel that uses the active matrix substrate that includes the edge portions that are relatively short is incorporated in a product, the degree of freedom of the design of the product is improved.

In the first structure, a region that is occupied by the multiple data signal line connection wires and a region that is occupied by the multiple divided common electrode wire connection wires may not overlap in a plan view (a second structure).

With the second structure described above, there is no capacitance due to overlapping of data signal line connection wires and divided common electrode wire connection wires, and the load of the connection wires can be decreased. Accordingly, the connection wires can be thinned, and the size of the region that is occupied by the connection wires can be decreased.

In the second structure, the scanning signal lines may be composed of a first conductive film, the data signal lines may be composed of a second conductive film, the divided common electrode wires may be composed of a third conductive film, and one of two adjacent data signal line connection wires of the data signal line connection wires may be composed of a conductive film among the first conductive film, the second conductive film, and the third conductive film, and the other may be composed of a conductive film that differs from the conductive film of which the one is composed among the first conductive film, the second conductive film, and the third conductive film (a third structure). The scanning signal lines may be composed of a first conductive film, the data signal lines may be composed of a second conductive film, the divided common electrode wires may be composed of a third conductive film, and one of two adjacent divided common electrode wire connection wires of the divided common electrode wire connection wires may be composed of a conductive film among the first conductive film, the second conductive film, and the third conductive film, and the other may be composed of a conductive film that differs from the conductive film of which the one is composed among the first conductive film, the second conductive film, and the third conductive film (a fourth structure).

With the third structure or the fourth structure described above, the multiple data signal line connection wires can be formed in respective different layers, or the multiple divided common electrode wire connection wires can be formed in respective different layers, and accordingly, adjacent connection wires can be electrically insulated from each other even when being close to each other in a plan view. Consequently, a possibility that a short circuit occurs is reduced, and the connection wires that have narrow pitches can be constituted. Consequently, the size of the frame near the edge portions can be decreased.

In the second structure, a circuit that includes a first conductive film and a second conductive film may be disposed around the pixel region, the divided common electrode wire connection wires may be composed of a third conductive film, and the circuit and the divided common electrode wire connection wires may overlap in a plan view (a fifth structure).

With the fifth structure described above, the divided common electrode wire connection wires can be stretched in an upper layer (or a lower layer) on the circuit in a manner in which the divided common electrode wire connection wires are composed of the third conductive film. Consequently, the size of the frame of each edge portion can be decreased.

In the fifth structure, the divided common electrode wire connection wires may include a portion that obliquely extends at an angle with respect to a direction in which the circuit is disposed in a plan view in a region in which the circuit and the divided common electrode wire connection wires overlap (a sixth structure).

With the sixth structure described above, the multiple divided common electrode wire connection wires can have the layout of a sectorial shape. This enables the size of the frame of each edge portion to be smaller than that in the case where the multiple divided common electrode wire connection wires have the layout of a region wider than that in the case of the layout of the sectorial shape such as the layout of a rectangle.

In any one of the first to sixth structures, the pixel region may have a circular shape, and the active matrix substrate may have two edges having straight sides such that an imaginary circle that has a diameter larger than a diameter of the pixel region is partly cut (a seventh structure).

With the seventh structure described above, the pixel region that has the circular shape enables the design feature to be improved and enables the edge portions for mounting, for example, the terminals to be formed.

In the seventh structure, the center of a circle of the pixel region may match the center of the imaginary circle (an eighth structure).

With the eighth structure described above, the dimension of the circle of the active matrix substrate in the radial direction can be smaller than that in the case where the center of the circle of the pixel region does not match the center of the imaginary circle.

A display panel with a ninth structure may include the active matrix substrate with any one of the first to eighth structures.

The ninth structure described above enables the display panel that can increase the degree of freedom of the design of a product as in the first structure described above to be provided.

The present disclosure contains subject matter related to that disclosed in U.S. Provisional Patent Application No. 63/086,731 filed in the U.S. Patent Office on Oct. 2, 2020, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate that has a pixel region and that includes multiple pixels that are disposed in the pixel region, the active matrix substrate comprising:
    multiple scanning signal lines;
    multiple data signal lines that intersect the multiple scanning signal lines;
    multiple switching elements that are disposed at respective multiple intersecting portions of the multiple data signal lines and the multiple scanning signal lines;
    multiple pixel electrodes that are connected to the respective multiple switching elements;
    a common electrode that is disposed in the pixel region, the common electrode including multiple divided common electrodes that are divided in a matrix;
    multiple divided common electrode wires that are connected to the respective multiple divided common electrodes and that are disposed in the pixel region;
    multiple data signal terminals that are disposed at a first end portion of the active matrix substrate;
    divided common electrode terminals that are disposed at a second end portion that differs from the first end portion of the active matrix substrate;
    multiple data signal line connection wires that connect the multiple data signal lines and the multiple data signal terminals to each other; and
    multiple divided common electrode wire connection wires that connect the multiple divided common electrode wires and the multiple divided common electrode terminals to each other,
    wherein a distance between end portions of the multiple data signal line connection wires facing the multiple data signal terminals is shorter than a distance between end portions of the multiple data signal line connection wires facing the pixel region,
    wherein a distance between end portions of the multiple divided common electrode wire connection wires facing the divided common electrode terminals is shorter than a distance between end portions of the multiple divided common electrode wire connection wires facing the pixel region, and
    wherein a region that is occupied by the multiple data signal line connection wires and a region that is occupied by the multiple divided common electrode wire connection wires do not overlap in a plan view.

2. The active matrix substrate according to claim 1,
    wherein the scanning signal lines are composed of a first conductive film,
    wherein the data signal lines are composed of a second conductive film,
    wherein the divided common electrode wires are composed of a third conductive film, and
    wherein one of two adjacent data signal line connection wires of the data signal line connection wires is composed of a conductive film among the first conductive film, the second conductive film, and the third conductive film, and the other is composed of a conductive film that differs from the conductive film of which the one is composed among the first conductive film, the second conductive film, and the third conductive film.

3. The active matrix substrate according to claim 1,
    wherein the scanning signal lines are composed of a first conductive film,
    wherein the data signal lines are composed of a second conductive film,
    wherein the divided common electrode wires are composed of a third conductive film, and
    wherein one of two adjacent divided common electrode wire connection wires of the divided common electrode wire connection wires is composed of a conductive film among the first conductive film, the second conductive film, and the third conductive film, and the other is composed of a conductive film that differs from the conductive film of which the one is composed among the first conductive film, the second conductive film, and the third conductive film.

4. The active matrix substrate according to claim 1,
    wherein a circuit that includes a first conductive film and a second conductive film is disposed around the pixel region,
    wherein the divided common electrode wire connection wires are composed of a third conductive film, and
    wherein the circuit and the divided common electrode wire connection wires overlap in a plan view.

5. The active matrix substrate according to claim 4, wherein the divided common electrode wire connection wires include a portion that obliquely extends at an angle with respect to a direction in which the circuit is disposed in a plan view in a region in which the circuit and the divided common electrode wire connection wires overlap.

6. The active matrix substrate according to claim 1,
    wherein the pixel region has a circular shape, and
    wherein the active matrix substrate has two edges having straight sides such that an imaginary circle that has a diameter larger than a diameter of the pixel region is partly cut.

7. The active matrix substrate according to claim 6, wherein a center of a circle of the pixel region matches a center of the imaginary circle.

8. A display panel comprising:
    the active matrix substrate according to claim 1.

* * * * *